United States Patent [19]
Takahashi

[11] Patent Number: 5,960,264
[45] Date of Patent: *Sep. 28, 1999

[54] METHOD OF MANUFACTURING AN INSULATED GATE SEMICONDUCTOR DEVICE

[75] Inventor: Hideki Takahashi, Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/939,496

[22] Filed: Sep. 29, 1997

Related U.S. Application Data

[62] Division of application No. 08/601,161, Feb. 13, 1996, Pat. No. 5,801,408.

[30] Foreign Application Priority Data

Jul. 21, 1995 [JP] Japan ..................................... 7-185783

[51] Int. Cl.⁶ .................................................. H01L 21/332
[52] U.S. Cl. ........................................... 438/133; 438/138
[58] Field of Search .................................... 438/133, 135, 438/137, 138, 268, 269, 270, 271

[56] References Cited

U.S. PATENT DOCUMENTS

| | | |
|---|---|---|
| 4,860,072 | 8/1989 | Zommer . |
| 5,034,336 | 7/1991 | Seki ........................................ 438/138 |
| 5,034,785 | 7/1991 | Blanchard . |
| 5,169,793 | 12/1992 | Okabe et al. . |
| 5,182,222 | 1/1993 | Malhi et al. . |
| 5,326,711 | 7/1994 | Malhi ...................................... 438/138 |
| 5,387,528 | 2/1995 | Hutchings et al. ............ 148/DIG. 126 |
| 5,405,794 | 4/1995 | Kim ............................... 148/DIG. 126 |
| 5,489,787 | 2/1996 | Amaratunga et al. . |
| 5,665,619 | 9/1997 | Kwan et al. .............................. 438/270 |
| 5,714,781 | 2/1998 | Yamamoto et al. ..................... 257/329 |

FOREIGN PATENT DOCUMENTS

| | | |
|---|---|---|
| 0 068 945 | 1/1983 | European Pat. Off. . |
| 0 583 028 | 2/1994 | European Pat. Off. . |
| 60-253275 | 12/1985 | Japan . |

OTHER PUBLICATIONS

Patent Abstracts of Japan, vol. 94, No. 011, Nov. 4, 1994 & JP 06 310727, Nov. 4, 1994.
Patent Abstracts of Japan, vol. 012, No. 268 (E–638), Jul. 27, 1988 & JP 63 050071, Mar. 2, 1988.
Patent Abstracts of Japan, vol. 013, No. 493 (E–842), Nov. 8, 1989 & JP 01 198076, Aug. 9, 1989.
Proceedings of the International Symposium on Power Semiconductor Devices, pp. 411–416, May 31, 1994 M. Harada, et al., "600V Trench IGBT, in Comparison with Planar IGBT—An Evaluation of the Limit of IGBT Performance".

*Primary Examiner*—Tuan H. Nguyen
*Attorney, Agent, or Firm*—Oblon, Spivak, McClelland, Maier & Neustadt, P.C.

[57] ABSTRACT

A parasitic transistor of an insulated gate semiconductor device does not easily turn on, so that an SOA of the insulated gate semiconductor device is improved. P⁺ semiconductor layers (45) having a higher impurity concentration than that N⁺ emitter layers (44) are disposed so that the P⁺ semiconductor layers (45) overlap adjacent edges of the N⁺ emitter layers (44) of a U-type IGBT and so that bottom portions of the P⁺ semiconductor layers (45) contact P base layers (43). An emitter electrode (51) contacts the P base layers (43) through the P⁺ semiconductor layers (45). A trench pitch is small, and therefore, a parasitic transistor which is formed by an N⁺ emitter region (4), a P base layer (3) and an N⁻ layer (2) does not easily turn on.

15 Claims, 16 Drawing Sheets

5,960,264

METHOD OF MANUFACTURING AN INSULATED GATE SEMICONDUCTOR DEVICE

This is a division, of application Ser. No. 08/601,161 filed on Feb. 13, 1996, now U.S. Pat. No. 5,801,408.

BACKGROUND OF THE INVENTION

1. Field of the Invention

The present invention relates to an insulated gate semiconductor device and a method of manufacturing the same. More particularly, the present invention relates to a device structure in which a parasitic transistor of an insulated gate bipolar transistor which comprises a trench MOS gate does not turn on easily so that a safe operating area (hereinafter "SOA") is large, and also relates to a method of manufacturing the same.

2. Description of the Background Art

FIG. 26 is a partial sectional view of a conventional insulated gate semiconductor device. As an example, an insulated gate bipolar transistor (hereinafter "IGBT"), in particular, an IGBT having a trench gate structure (and IGBT having a trench gate structure will be hereinafter referred to as a "U-type IGBT.") will be described.

In recent years, in a voltage oscillating circuit which serves as a high frequency invertor, a general use invertor, an AC servo, an air conditioner, etc., IGBTs have been very often used in various devices such as an intelligent power module which controls a variable speed of a tri-phase motor, to reduce energy consumption, the size and the weight of electric household appliances. While a switching characteristic, a saturation voltage and an SOA are in a trade-off relationship with each other in IGBTs, i.e., key devices in these various devices, IGBTs with a better switching characteristic, a low saturation voltage and a large SOA are demanded.

In FIG. 26, denoted at 1 is a P+ collector layer, denoted at 2 is an N− layer, denoted at 3 is a P base layer, denoted at 4 are N+ emitter regions, denoted at 5 are trenches, denoted at 6 are gate insulation films, denoted at 7 are gate electrodes, denoted at 8 is an interlayer insulation film, denoted at 9 is an N+ buffer layer, denoted at 10 is an emitter electrode, denoted at 11 is a collector electrode, and denoted at 12 are channel regions.

Now, an operation of an IGBT will be described.

When a predetermined collector voltage $V_{CE}$ is applied across the emitter electrode 10 and the collector electrode 11 and a predetermined gate voltage $V_{GE}$ is applied across the emitter electrode 10 and the gate electrodes 7, that is, when gates are turned on, the channel regions 12 are inverted into the N type, thereby creating channels. Through these channels, electrons are injected into the N− layer 2 from the emitter electrode 10. Injected electrons apply a forward bias across the P+ collector layer 1 and the N− layer 2 so that holes are injected into the N− layer 2 from the collector electrode 11 through the P+ collector layer 1 and the N+ buffer layer 9. The conductivity is changed consequently, and the resistance of the N− layer 2 is largely decreased to increase a current capacity of the IGBT. Collector-emitter voltage drop during this state (ON state) in the IGBT defines an ON-voltage ($V_{CE}$(sat)).

To change the IGBT from an ON state into an OFF state, the gate voltage $V_{GE}$ applied across the emitter electrode 10 and the gate electrodes 7 is changed to 0 V or a reverse bias is applied across the emitter electrode 10 and the gate electrodes 7, thereby turning the gates off. As a result, the channel regions 12 inverted into the N type return to the P type so that injection of electrons from the emitter electrode 10 stops. Electrons and holes accumulated in the N− layer 2 then flow into the collector electrode 11 and the emitter electrode 10, respectively, or recombine with each other to perish.

The ON-voltage of the IGBT is primarily determined by a substantial resistance of the N− layer 2 which is necessary to hold a breakdown voltage. One of the factors which determines the substantial resistance is an ability of a MOSFET which forms the IGBT to supply electrons.

In a U-type IGBT in which narrow and deep grooves (trenches) are formed in a surface of a chip and MOSFETs are formed in side walls of the trenches, the ability of the MOSFETs to supply electrons is enhanced by reducing intervals between unit cells as much as possible.

In general, a cut-off current value under an applied high voltage is an important electric characteristic of an IGBT. It is therefore preferable to ensure as high a cut-off current value as possible. The better this electric characteristic is, the larger a reverse bias safe operating area (hereinafter "RBSOA") becomes.

Meanwhile, as can be clearly understood from FIG. 26 which shows the structure of the U-type IGBT, the U-type IGBT includes a parasitic bipolar transistor which is formed by the N+ emitter regions 4, the P base layer 3 and the N− layer 2.

When the parasitic bipolar transistor is turned on, the gate voltage $V_{GE}$ alone can not control a current which flows in the U-type IGBT any more, whereby the U-type IGBT is destroyed. Hence, as a measure to enlarge the RBSOA, various device structures have been proposed in which the cell size is small, using a trench gate structure so that the parasitic bipolar transistor does not easily turn on.

FIG. 27 is a partial sectional view showing an example of a conventional insulated gate semiconductor device which is described in Japanese Patent Unscreened Publication No. 60-253275.

In FIG. 27, denoted at 13 is a semiconductor substrate, denoted at 14 is a first major surface of the semiconductor substrate 13, and denoted at 15 are P+ regions. The other reference symbols are similar to those used in FIG. 24. The P+ regions 15 of the N+ emitter regions 4 are disposed simply to ensure a better contact with the emitter electrode 10. The impurity concentration of the P+ regions 15 is lower than that of the N+ emitter regions.

In this conventional insulated gate semiconductor device, when the same mask is used as a mask for forming the N+ emitter regions 4 and a mask for forming the V-shaped gate electrodes 7, alignment of masks becomes unnecessary and intervals between cells are reduced. However, since the gate electrodes 7 project from the first major surface 14 of the semiconductor substrate 13, to ensure the N+ emitter regions 4 contact the P+ regions 15 while allowing the interlayer insulation film 8 to be interposed across the emitter electrode 10 and the gate electrodes 7, the N+ emitter regions 4 must be formed large including an additional margin, when masks are aligned to each other during formation of the interlayer insulation film 8. This serves as an obstacle to an effort to reduce the intervals between the cells.

FIG. 28 is a schematic diagram showing a contact margin in the conventional technique.

In FIG. 28, the gate electrodes 7 are trench type electrodes rather than V-shaped electrodes. FIG. 28 shows additional areas which are necessary for the N+ emitter regions 4 to deal with misalignment of the masks (i.e., gate contact margins).

FIG. 29 is a partial sectional view showing an example of a conventional insulated gate semiconductor device which is described in U.S. Pat. No. 5,034,785. The intervals between cells are shorter in the illustrative device since the illustrative device does not use the gate contact margins which are used in the conventional technique of FIG. 28.

The device shown in FIG. 29 is a DMOS power transistor, and includes a gate of a trench structure. The gate electrodes 7 have a surface which is recessed from the first major surface 14 of the semiconductor substrate 13. Denoted at 16 is a source electrode.

In the illustrative structure, the surfaces of the gate electrodes 7 are recessed from the first major surface 14 of the semiconductor substrate 13. This makes a mask unneeded to form the gate electrodes 7 and makes it unnecessary for the source electrode to have a margin for alignment of the masks. Hence, it is possible to reduce the trench pitch.

However, it is necessary to form the N+ source region 16 deeper than the surfaces of the gate electrodes 7. The N+ source region 16 therefore tends to be deeper. Since the N+ source region 16 is formed by diffusion in most cases, when the N+ source region 16 is diffused deep, the N+ source region 16 is diffused wide. This increases the trench pitch.

FIG. 30 is a schematic diagram showing side diffusion in the conventional structure. The illustrative device is an IGBT.

In FIG. 30, to ensure that the surfaces of the gate electrodes 7 are recessed from the surfaces of the N+ emitter regions 4, the N+ emitter regions 4 are formed deeper and therefore side diffusion of the N+ emitter regions 4 is large. Hence, to make an exposed surface of the P base layer 3 and the surfaces of the N+ emitter regions 4 contact each other at the emitter electrode 10, the trench pitch must be formed large. This allows the parasitic transistor to easily turn on.

Another value which is related to the SOA of an element is saturation current $I_C(sat)$.

The value of a current which flows in an IGBT in response to a certain applied gate voltage is expressed as $I_C(sat)$. If the value $I_C(sat)$ is too large, the parasitic transistor easily turns on, which in turn destroys the IGBT.

SUMMARY OF THE INVENTION

A first aspect of the present invention relates to an insulated gate semiconductor device, comprising: a first semiconductor layer of a first conductivity type, the first semiconductor layer including a first major surface and a second major surface; a second semiconductor layer of a second conductivity type which is disposed on the first major surface of the first semiconductor layer, the second semiconductor layer having a low impurity concentration; a third semiconductor layer of the first conductivity type which is disposed on a surface of the second semiconductor layer; a fourth semiconductor layer of the second conductivity type which is selectively disposed on a portion of a surface of the third semiconductor layer; a groove-shaped inner wall being at least one in number defining an opening which opens in a surface of the fourth semiconductor layer so as to extend in a direction along the surface of the fourth semiconductor layer, the groove-shaped inner wall extending along a depth direction thereof from the surface of the fourth semiconductor layer to the second semiconductor layer; a fifth semiconductor layer of the second conductivity type which is disposed on the surfaces of the third and the fourth semiconductor layers to extend across the third and the fourth semiconductor layers, a junction between the fifth semiconductor layer and the fourth semiconductor layer being exposed to a surface, a bottom surface of the fifth semiconductor layer being located at a shallower position than a bottom surface of the fourth semiconductor layer, the fifth semiconductor layer having a higher impurity concentration than the fourth semiconductor layer; an insulation film covering the inner wall and a surface of the fourth semiconductor layer which is continuous to the inner wall and is in the vicinity of the opening; a control electrode which is disposed on a surface of the inner wall through the insulation film so as to have a recessed surface which is recessed from a surface of a portion of the insulation film covering the surface of the fourth semiconductor layer; a first major electrode which is disposed on the surfaces of the fourth and the fifth semiconductor layers; and a second major electrode which is disposed on the second major surface of the first semiconductor layer.

According to a second aspect of the present invention, in the insulated gate semiconductor device of the first aspect, the groove-shaped inner wall is groove-shaped inner walls plural in number, and an exposed surface of the fifth semiconductor layer between adjacent two of the groove-shaped inner walls extends along the groove-shaped inner walls.

According to a third aspect of the present invention, in the insulated gate semiconductor device of the second aspect, the exposed surface of the fifth semiconductor layer has a scattered configuration.

A fourth aspect of the present invention relates to an insulated gate semiconductor device, comprising: a first semiconductor layer of a first conductivity type, the first semiconductor layer including a first major surface and a second major surface; a second semiconductor layer of a second conductivity type which is disposed on the first major surface of the first semiconductor layer, the second semiconductor layer having a low impurity concentration; a third semiconductor layer of the first conductivity type which is disposed on a surface of the second semiconductor layer; a fourth semiconductor layer of the second conductivity type which is selectively disposed on a portion of a surface of the third semiconductor layer; groove-shaped inner walls plural in number, each one thereof defining an opening which opens in a surface of the fourth semiconductor layer so as to extend in a direction along the surface of the fourth semiconductor layer, the groove-shaped inner walls extending along a depth direction thereof from the surface of the fourth semiconductor layer to the second semiconductor layer; a fifth semiconductor layer of the second conductivity type which is disposed on the surfaces of the third and the fourth semiconductor layers which are present between adjacent two of the groove-shaped inner walls so as to extend across the third and the fourth semiconductor layers in a configuration scattered along the adjacent two, a junction between the fifth semiconductor layer and the fourth semiconductor layer being exposed to a surface, the fifth semiconductor layer having a higher impurity concentration than the fourth semiconductor layer; an insulation film covering the groove-shaped inner walls, a portion of a surface of the fourth semiconductor layer which is continuous to and adjacent to the groove-shaped inner walls, and a portion of a surface of the fifth semiconductor layer which is adjacent to the portion of the surface of the fourth semiconductor layer; a control electrode which is disposed on surfaces of the groove-shaped inner walls through the insulation film so as to have a recessed surface which is recessed from a surface of a portion of the insulation film covering the portion of the surface of the fourth semiconductor layer; a first major electrode which is disposed on the surfaces of the fourth and the fifth semiconductor layers; and a second major electrode which is disposed on the second major surface of the first semiconductor layer.

A fifth aspect of the present invention relates to an insulated gate semiconductor device, comprising: a first semiconductor layer of a first conductivity type, the first semiconductor layer including a first major surface and a second major surface; a second semiconductor layer of a second conductivity type which is disposed on the first major surface of the first semiconductor layer, the second semiconductor layer having a low impurity concentration; a third semiconductor layer of the first conductivity type which is disposed on a surface of the second semiconductor layer; fourth semiconductor layers of the second conductivity type which are plural in number and are disposed parallel to each other in the shape of columns on a portion of a surface of the third semiconductor layer; groove-shaped inner walls plural in number defining openings respectively which open in respective surfaces of the fourth semiconductor layers so as to extend along the columns of the fourth semiconductor layers, the groove-shaped inner walls extending along a depth direction thereof from the surfaces of the fourth semiconductor layers to the second semiconductor layer; a fifth semiconductor layer of the second conductivity type which is disposed on the surfaces of the third and the fourth semiconductor layers to extend across the third and the fourth semiconductor layers, a junction between the fifth semiconductor layer and the fourth semiconductor layers being exposed to a surface, a bottom surface of the fifth semiconductor layer being located at a shallower position than bottom surfaces of the fourth semiconductor layers, the fifth semiconductor layer having a higher impurity concentration than the fourth semiconductor layers; an insulation film covering the groove-shaped inner walls and surfaces of the fourth semiconductor layers which are in the vicinity of the openings and are continuous to the groove-shaped inner walls; a control electrode which is disposed on surfaces of the groove-shaped inner walls through the insulation film so as to have a recessed surface which is recessed from a surface of a portion of the insulation film covering the surfaces of the fourth semiconductor layers; a first major electrode which is disposed on the surfaces of the fourth and the fifth semiconductor layers and the interlayer insulation film; and a second major electrode which is disposed on the second major surface of the first semiconductor layer.

According to a sixth aspect of the present invention, in the insulated gate semiconductor device of the fifth aspect, the fifth semiconductor layer is disposed in a scattered configuration along the fourth semiconductor layers.

A seventh aspect of the present invention relates to an insulated gate semiconductor device, comprising: a first semiconductor layer of a first conductivity type, the first semiconductor layer including a first major surface and a second major surface; a second semiconductor layer of a second conductivity type which is disposed on the first major surface of the first semiconductor layer, the second semiconductor layer having a low impurity concentration; a third semiconductor layer of the first conductivity type which is disposed on a surface of the second semiconductor layer; fourth semiconductor layers of the second conductivity type which are plural in number and are disposed parallel to each other in the shape of columns on a portion of a surface of the third semiconductor layer; groove-shaped inner walls plural in number defining openings respectively which open in respective surfaces of the fourth semiconductor layers so as to extend in a direction along the columns of the fourth semiconductor layers, the groove-shaped inner walls extending along a depth direction thereof from the surfaces of the fourth semiconductor layers to the second semiconductor layer; a fifth semiconductor layer of the second conductivity type which is disposed in a scattered configuration along the fourth semiconductor layers and on the surfaces of the third and the fourth semiconductor layers to extend across the third and the fourth semiconductor layers, a junction between the fifth semiconductor layer and the fourth semiconductor layers being exposed to a surface, the fifth semiconductor layer having a higher impurity concentration than the fourth semiconductor layers; an insulation film covering the groove-shaped inner walls, surfaces of the fourth semiconductor layers which are continuous to, adjacent to, and lying along the groove-shaped inner walls, and a portion of a surface of the fifth semiconductor layer which is in the vicinity of the fourth semiconductor layers; a control electrode which is disposed on surfaces of the groove-shaped inner walls through the insulation film so as to have a recessed surface which is recessed from a surface of a portion of the insulation film covering surfaces of the fourth semiconductor layers; an interlayer insulation film which is disposed on a surface of the control electrode; a first major electrode which is disposed on the surfaces of the fourth and the fifth semiconductor layers and the interlayer insulation film; and a second major electrode which is disposed on the second major surface of the first semiconductor layer.

An eighth aspect of the present invention relates to an insulated gate semiconductor device, comprising: a first semiconductor layer of a first conductivity type, the first semiconductor layer including a first major surface and a second major surface; a second semiconductor layer of a second conductivity type which is disposed on the first major surface of the first semiconductor layer, the second semiconductor layer having a low impurity concentration; a third semiconductor layer of the first conductivity type which is disposed on a surface of the second semiconductor layer; a fourth semiconductor layer of the second conductivity type which is formed on a surface of the third semiconductor layer so as to leave an exposed surface of the third semiconductor layer in a scattered configuration; a groove-shaped inner wall being at least one in number defining an opening which opens in a surface of the fourth semiconductor layer so as to extend in a direction along the surface of the fourth semiconductor layer, the groove-shaped inner wall extending along a depth direction thereof from the surface of the fourth semiconductor layer to the second semiconductor layer; an insulation film covering the groove-shaped inner wall, a portion of a surface of the fourth semiconductor layer which is in the vicinity of the opening and is continuous to the inner wall, and a portion of a surface of the third semiconductor layer which is adjacent to the fourth semiconductor layer; a control electrode which is disposed on surfaces of the groove-shaped inner walls through the insulation film so as to have a recessed surface which is recessed from a surface of a portion of the insulation film covering a surface of the fourth semiconductor layer; a first major electrode which is disposed on the surfaces of the fourth and the fifth semiconductor layers and the interlayer insulation film; and a second major electrode which is disposed on the second major surface of the first semiconductor layer.

According to a ninth aspect of the present invention, in the insulated gate semiconductor device of the eighth aspect, the groove-shaped inner wall is groove-shaped inner walls plural in number, an exposed surface of the third semiconductor layer is disposed between and along adjacent two of the groove-shaped inner walls, and extends in a longitudinal direction of the adjacent two.

A tenth aspect of the present invention relates to a method of manufacturing an insulated gate semiconductor device, comprising: a first step of forming a semiconductor substrate which comprises a first semiconductor layer of a first conductivity type and a second semiconductor layer of a second conductivity type disposed on a surface of the first semiconductor layer; a second step of implanting impurities of the first conductivity type into a first major surface of the semiconductor substrate which is on the second semiconductor layer side of the semiconductor substrate to thereby form a third semiconductor layer of the first conductivity type; a third step of stacking a resist on the first major surface, selectively removing the resist to obtain a resist pattern, selectively implanting impurities of the second conductivity type using the resist pattern as a mask, and diffusing the impurities of the second conductivity type in a surface of the third semiconductor layer to thereby selectively form a fourth semiconductor layer of the second conductivity type having a higher impurity concentration than the second semiconductor layer; a fourth step of forming a shielding film on the first major surface, forming an opening in the shielding film on a portion of a surface of the fourth semiconductor layer so that the opening extends along a surface of the shielding film, selectively removing a semiconductor down to the second semiconductor layer while using as a mask the shielding film which includes the opening to thereby form a groove-shaped inner wall which defines a groove, and thereafter removing the shielding film; a fifth step of forming an insulation film on a surface of the groove-shaped inner wall and on the first major surface; a sixth step of stacking a conductive material on the insulation film so that the groove is filled up; a seventh step of uniformly removing the conductive material, while leaving the insulation film, until a surface of the conductive material which is buried in the groove is recessed from a surface of a portion of the insulation film formed on the first major surface; an eighth step of stacking a resist on a portion of the insulation film, which is exposed on the first major surface after the seventh step, and the surface of the conductive material, forming an opening therein at such a position as to surround an area which corresponds to the resist which is selectively left at the third step and to surround a portion of the surface of the fourth semiconductor layer which is adjacent to the area, selectively implanting impurities of the first conductivity type at a higher impurity concentration than that of the fourth semiconductor layer through the insulation film while using the resist as a mask which includes the opening, and diffusing the impurities of the first conductivity type shallower than a bottom of the fourth semiconductor layer to thereby selectively form a fifth semiconductor layer of the first conductivity type connecting the third semiconductor layer; a ninth step of stacking an insulation material on the portion of the insulation film, which is exposed at the seventh step, and on a surface of the conductive material; a tenth step of stacking a resist on a surface of the insulation material, forming an opening therein which surrounds the fifth semiconductor layer, and a portion of the fourth semiconductor layer which is adjacent to the fifth semiconductor layer, selectively removing the insulation material and the insulation film while using the resist as a mask which includes the opening to thereby expose the fifth and the fourth semiconductor layers; an eleventh step of stacking a conductive layer on the fourth and fifth semiconductor layers, which are exposed after the tenth step and on the surface of the insulation material; and a twelfth step of stacking a conductive layer on a second major surface of the semiconductor substrate which is on an opposite side to the first major surface.

An eleventh aspect of the present invention relates to a method of manufacturing an insulated gate semiconductor device, comprising: a first step of forming a semiconductor substrate which comprises a first semiconductor layer of a first conductivity type and a second semiconductor layer of a second conductivity type disposed on a surface of the first semiconductor layer; a second step of implanting impurities of the first conductivity type into a first major surface of the semiconductor substrate which is on the second semiconductor layer side of the semiconductor substrate to thereby form a third semiconductor layer of the first conductivity type; a third step of stacking a resist on the first major surface, selectively removing the resist to leave a portion of the resist as a plurality of regions which are arranged parallel to each other in the shape of columns so that a resist pattern is formed, selectively implanting impurities of the second conductivity type while using the resist pattern as a mask, and diffusing the impurities of the second conductivity type in a surface of the third semiconductor layer to thereby selectively form fourth semiconductor layers of the second conductivity type having a higher impurity concentration than the second semiconductor layer; a fourth step of forming a shielding film on the first major surface, forming an opening in the shielding film on a portion of a surface of the fourth semiconductor layers so that the opening extends along a surface of columns of the fourth semiconductor layers, selectively removing a semiconductor down to the second semiconductor layer while using the shielding film as a mask which includes the opening to thereby form groove-shaped inner walls which define grooves, and thereafter removing the shielding film; a fifth step of forming an insulation film on surfaces of the groove-shaped inner walls and on the first major surface; a sixth step of stacking a conductive material on the insulation film so that the grooves are filled up; a seventh step of uniformly removing the conductive material, while leaving the insulation film until a surface of the conductive material which is buried in the grooves is recessed from a surface of a portion of the insulation film which is formed on the first major surface; an eighth step of stacking a resist on a portion of the insulation film, which is exposed on the first major surface after the seventh step, and the surface of the conductive material, forming an opening therein at such a position as to surround an area which corresponds to the resist which is left in the shape of columns at the third step and to surround portions of surfaces of the fourth semiconductor layers which are adjacent to the area, selectively implanting impurities of the first conductivity type at a higher impurity concentration than that of the fourth semiconductor layers through the insulation film while using the resist as a mask which includes the opening, and diffusing the impurities of the first conductivity type shallower than bottoms of the fourth semiconductor layers to thereby selectively form a fifth semiconductor layer of the first conductivity type connecting the third semiconductor layer; a ninth step of stacking an insulation material on the portion of the insulation film, which is exposed after the seventh step, and on a surface of the conductive material; a tenth step of stacking a resist on a surface of the insulation material, forming an opening therein which surrounds the fifth semiconductor layer and portions of the fourth semiconductor layers which are adjacent to the fifth semiconductor layer, selectively removing the insulation material and the insulation film while using the resist as a mask which includes the opening to thereby expose the fifth and the fourth semiconductor layers; an eleventh step of stacking a conductive layer on the fourth and fifth semiconductor layers which are exposed after the tenth step and on the surface of the insulation material; and a twelfth step of stacking a conductive layer on a second major surface of the semiconductor substrate which is on an opposite side to the first major surface.

According to a twelfth aspect of the present invention, in the method of the eleventh aspect, at the third step, the portion of the resist is left as a plurality of regions which are scattered in the shape of columns and are arranged parallel to each other to thereby obtain the resist pattern, and at the tenth step, the opening of the resist is formed to surround the fifth and the fourth semiconductor layers except for portions of the surfaces of the fourth semiconductor layers which are adjacent to and along the inner walls.

A thirteenth aspect of the present invention relates to a method of manufacturing an insulated gate semiconductor device, comprising: a first step of forming a semiconductor substrate which comprises a first semiconductor layer of a first conductivity type and a second semiconductor layer of a second conductivity type disposed on a surface of the first semiconductor layer; a second step of implanting impurities of the first conductivity type into a first major surface of the semiconductor substrate which is on the second semiconductor layer side of the semiconductor substrate to thereby form a third semiconductor layer of the first conductivity type; a third step of stacking a resist on the first major surface, selectively removing the resist to leave a portion of the resist as a plurality of regions which are scattered in the shape of columns and arranged parallel to each other so that a resist pattern is formed, selectively implanting impurities of the second conductivity type using the resist pattern as a mask, and diffusing the impurities of the second conductivity type in a surface of the third semiconductor layer to thereby form fourth semiconductor layers of the second conductivity type having a higher impurity concentration than the second semiconductor layer; a fourth step of forming a shielding film on the first major surface, forming an opening in the shielding film on a portion of a surface of the fourth semiconductor layers so that the opening extends along a surface of columns of the fourth semiconductor layers, selectively removing a semiconductor down to the second semiconductor layer while using the shielding film as a mask which includes the opening to thereby form groove-shaped inner walls which define grooves, and thereafter removing the shielding film; a fifth step of forming an insulation film on surfaces of the groove-shaped inner walls and on the first major surface; a sixth step of stacking a conductive material on the insulation film so that the grooves are filled up; a seventh step of uniformly removing the conductive material while leaving the insulation film until a surface of the conductive material which is buried in the grooves is recessed from a surface of a portion of the insulation film which is formed on the first major surface; an eighth step of stacking a resist on a portion of the insulation film, which is exposed on the first major surface after the seventh step, and the surface of the conductive material, forming an opening therein at such a position as to surround an area which corresponds to the resist which is left in the shape of columns at the third step and to surround portions of surfaces of the fourth semiconductor layers which are adjacent to the area, selectively implanting impurities of the first conductivity type at a higher impurity concentration than that of the fourth semiconductor layers through the insulation film while using the resist as a mask which includes the opening, and diffusing the impurities of the first conductivity type to thereby selectively form a fifth semiconductor layer of the first conductivity type connecting the third semiconductor layer; a ninth step of stacking an insulation material on the portion of the insulation film, which is exposed after the seventh step, and on a surface of the conductive material; a tenth step of stacking a resist on a surface of the insulation material, forming an opening therein which surrounds the fifth semiconductor layer and the fourth semiconductor layers, except for the portions of the surfaces of the fourth semiconductor layers which are adjacent to and along the inner walls and except for a portion of a surface of the fifth semiconductor layer, selectively removing the insulation material and the insulation film while using the resist as a mask which includes the opening to thereby expose the fifth semiconductor layer and the fourth semiconductor layers; an eleventh step of stacking a conductive layer on the fourth and fifth semiconductor layers which are exposed after the tenth step and on the surface of the insulation material; and a twelfth step of stacking a conductive layer on a second major surface of the semiconductor substrate which is on an opposite side to the first major surface.

A fourteenth aspect of the present invention relates to a method of manufacturing an insulated gate semiconductor device, comprising: a first step of forming a semiconductor substrate which comprises a first semiconductor layer of a first conductivity type and a second semiconductor layer of a second conductivity type disposed on a surface of the first semiconductor layer; a second step of implanting impurities of the first conductivity type into a first major surface of the semiconductor substrate which is on the second semiconductor layer side of the semiconductor substrate to thereby form a third semiconductor layer of the first conductivity type; a third step of stacking a resist on the first major surface, selectively removing the resist to leave a portion of the resist as a plurality of regions which are scattered in the shape of columns and arranged parallel to each other so that a resist pattern is formed, selectively implanting impurities of the second conductivity type using the resist pattern as a mask, and diffusing the impurities of the second conductivity type in a surface of said third semiconductor layer so as to leave a portion of an exposed surface of the third semiconductor layer which is covered with the resist to thereby selectively form fourth semiconductor layers of the second conductivity type having a higher impurity concentration than the second semiconductor layer; a fourth step of forming a shielding film on the first major surface, forming an opening in the shielding film on a portion of a surface of the fourth semiconductor layers so that the opening extends along a surface of columns of the fourth semiconductor layers, selectively removing a semiconductor down to the second semiconductor layer while using the shielding film as a mask which includes the opening to thereby form groove-shaped inner walls which define grooves, and thereafter removing the shielding film; a fifth step of forming an insulation film on surfaces of the groove-shaped inner walls and on the first major surface; a sixth step of stacking a conductive material on the insulation film so that the grooves are filled up; a seventh step of uniformly removing the conductive material while leaving the insulation film until a surface of the conductive material which is buried in the grooves is recessed from a surface of a portion of the insulation film which is formed on the first major surface; an eighth step of stacking an insulation material on a portion of the insulation film which is exposed after the seventh step, and the surface of the conductive material; a ninth step of stacking a resist on a surface of the insulation material, forming an opening therein which surrounds the third semiconductor and fourth semiconductor layers, except for portions of surfaces of the fourth semiconductor layers which are adjacent to and along the inner walls and except for a portion of the exposed surface of the third semiconductor layer which is adjacent to the portions of the surfaces of the fourth semiconductor layers, selectively removing the insulation material and the insulation film while using a resist pattern which includes the opening to thereby expose the third semiconductor layer and the portions of the fourth semiconductor layers which are adjacent to the third semiconductor layer; a tenth step of stacking a conductive layer on the third and fourth semiconductor layer which is exposed after the ninth step and on the surface of the insulation material; and an eleventh step of stacking a conductive layer on the second major surface of the semiconductor substrate which is on an opposite side to the first major surface.

In the insulated gate semiconductor device constructed as defined in the first aspect of the present invention, the fifth semiconductor layer is disposed on the surfaces of the third and the fourth semiconductor layers to extend across the third and the fourth semiconductor layers, a junction between the fifth and the fourth semiconductor layers is exposed to a surface, and the bottom surface of the fifth semiconductor layer is located at a shallower position than the thickness of the fourth semiconductor layer. Therefore, even when the exposed surface of the third semiconductor layer which is adjacent to the fourth semiconductor layer becomes small, since the first major electrode creates a contact between the third and the fourth semiconductor layers through the fifth semiconductor layer, the cell size remains small, the ON-voltage is reduced, a parasitic transistor does not easily turn on, and the value of a current which can be terminated at turning off does not drop. Hence, the insulated gate semiconductor device uses small consumption power, an RBSOA of the insulated gate semiconductor device is large, and the reliability of the insulated gate semiconductor device is high.

In the insulated gate semiconductor device constructed as defined in the second aspect of the present invention, the plurality of the groove-shaped inner walls are disposed, the exposed surface of the fifth semiconductor layer is formed between adjacent inner walls, and the exposed surface extends along the inner walls in the direction of the longitudinal extension of the inner walls. Hence, it is possible to form a plurality of the control electrodes. Further, even when adjacent fourth semiconductor layers are extremely close to each other through the exposed surface of the fifth semiconductor layer, the first major electrode creates a contact between the third and the fourth semiconductor layers through the fifth semiconductor layer.

In the insulated gate semiconductor device, trench intervals are small and the device is small and dense.

In the insulated gate semiconductor device constructed as defined in the third aspect of the present invention, the exposed surface of the fifth semiconductor layer has a scattered configuration. Hence, at the link portion of the fourth semiconductor layer which separates the exposed surface portions of the fifth semiconductor layer which are located between adjacent inner walls, the first major electrode creates a contact between the third and the fourth semiconductor layers. Therefore, trench intervals are small in the insulated gate semiconductor device, and the insulated gate semiconductor device is small and dense.

In the insulated gate semiconductor device constructed as defined in the fourth aspect of the present invention, since the film covers the inner walls, the portions of the surfaces of the fourth semiconductor layers which are adjacent to each other along the inner walls and the portions of the surfaces of the fifth semiconductor layers which are adjacent to the portions of the fourth semiconductor layers, the link portions of the fourth semiconductor layers, which separate the fifth semiconductor layers which are located between adjacent inner walls, and the fifth semiconductor layers alternately contact the first major electrode, but the fourth semiconductor layers which are sandwiched by the fifth semiconductor layers and the inner walls do not contact the first major electrode. Hence, these portions serve as a resistance between the fourth semiconductor layers which contact the first major electrode. When a large current flows, the resistance induces a voltage drop within the fourth semiconductor layers. Hence, a parasitic transistor does not easily turn on in the insulated gate semiconductor device, an RBSOA of the insulated gate semiconductor device is large, the insulated gate semiconductor device is small and dense, and the reliability of the insulated gate semiconductor device is high.

In the insulated gate semiconductor device constructed as defined in the fifth aspect of the present invention, the fourth semiconductor layers sandwich the fifth semiconductor layer in the form of columns, the plurality of the inner walls are formed along this column-like arrangement, the interlayer insulation film is formed on the surface of the control electrode, and the first major electrode is disposed on the surfaces of the fourth and the fifth semiconductor layers and the interlayer insulation film. Hence, it is possible to form a plurality of the control electrodes. It is also possible to form the exposed surface of the fifth semiconductor layer small. Even without creating the additional area to the interlayer insulation film for the sake of aligning a mask, the first major electrode creates a contact between the third and the fourth semiconductor layers through the fifth semiconductor layer. This reduces trench intervals and the cell size. Therefore, the ON-voltage is reduced, a parasitic transistor does not easily turn on, and the value of a current which can be terminated at turning off does not drop. Hence, the insulated gate semiconductor device uses small consumption power, an RBSOA of the insulated gate semiconductor device is large, the reliability of the insulated gate semiconductor device is high, and the insulated gate semiconductor device is small and dense.

In the insulated gate semiconductor device constructed as defined in the sixth aspect of the present invention, since the exposed surface of the fifth semiconductor layer has a scattered configuration, the link portion of the fourth semiconductor layer which separates exposed surface portions of the fifth semiconductor layer which are located between adjacent inner walls is not coated with the interlayer insulation film. This link portion of the fourth semiconductor layer allows the first major electrode to create a contact between the third and the fourth semiconductor layers. Hence, the insulated gate semiconductor device has even smaller trench intervals, a small size and a high density.

In the insulated gate semiconductor device constructed as defined in the seventh aspect of the present invention, of the fourth semiconductor layers which are disposed through the fifth semiconductor layer which has a scattered configuration between adjacent inner walls, the insulation film covers those fourth semiconductor layers which are adjacent to each other along the wall surfaces and the portion of the fifth semiconductor layer which is in the vicinity of those fourth semiconductor layers. Hence, the link portions of the fourth semiconductor layers, which separate the fifth semiconductor layer into the scattered configuration, and the fifth semiconductor layer alternately contact the first major electrode. Since the fourth semiconductor layers which are sandwiched between the fifth semiconductor layer and the inner walls do not contact the first major electrode, these portions serve as a resistance between the fourth semiconductor layers which contact the first major electrode. When a large current flows, the resistance induces a voltage drop within the fourth semiconductor layers. Hence, a parasitic transistor does not easily turn on in the insulated gate semiconductor device, and an RBSOA of the insulated gate semiconductor device is large. Further, the breakdown characteristic during shorting is improved without increasing the cell size. The insulated gate semiconductor device is small and dense, and the reliability of the insulated gate semiconductor device is high.

In the insulated gate semiconductor device constructed as defined in the eighth aspect of the present invention, of the fourth semiconductor layers which are disposed through the third semiconductor layer which has a scattered configuration, the film covers those fourth semiconductor layers which are adjacent to each other along the wall surfaces and the portion of the third semiconductor layer which is in the vicinity of those fourth semiconductor layers. Hence, the link portions of the fourth semiconductor layers, which separate the third semiconductor layer, and the third semiconductor layer alternately contact the first major electrode. Since the fourth semiconductor layers which are sandwiched between the third semiconductor layer and the inner walls do not contact the first major electrode, these portions serve as a resistance between the fourth semiconductor layers which contact the first major electrode. When a large current flows, the resistance induces a voltage drop within the fourth semiconductor layers. Hence, a parasitic transistor does not easily turn on in the insulated gate semiconductor device, an RBSOA of the insulated gate semiconductor device is large, and the reliability of the insulated gate semiconductor device is high.

In the insulated gate semiconductor device constructed as defined in the ninth aspect of the present invention, the plurality of the groove-shaped inner walls are disposed, and the third semiconductor layer is disposed in the scattered configuration between adjacent inner walls along the inner walls. Of the fourth semiconductor layers which are disposed through the third semiconductor layer, the interlayer insulation film covers those fourth semiconductor layers which are adjacent to each other along the wall surfaces and the portion of the third semiconductor layer which is in the vicinity of those fourth semiconductor layers. Hence, it is possible to form a plurality of the control electrodes. Further, the link portions of the fourth semiconductor layers, which separate the third semiconductor layer, and the third semiconductor layer alternately contact the first major electrode, but the fourth semiconductor layers which are sandwiched by the third semiconductor layer and the inner walls do not contact the first major electrode. Hence, these portions serve as a resistance between the fourth semiconductor layers which contact the first major electrode. Even when the exposed surface of the third semiconductor layer becomes small, the first major electrode creates a contact between the third and the fourth semiconductor layers through the fifth semiconductor layer, and a voltage drop is created at the fourth semiconductor layers when a large current flows. Therefore, a parasitic transistor does not easily turn on in the insulated gate semiconductor device, an RBSOA of the insulated gate semiconductor device is large, the insulated gate semiconductor device is small and dense, and the reliability of the insulated gate semiconductor device is high.

In the method of manufacturing an insulated gate semiconductor device which is constructed as defined in the tenth aspect of the present invention, even when the exposed surface of the third semiconductor layer becomes small, the first major electrode creates a contact between the third and the fourth semiconductor layers through the fifth semiconductor layer. Hence, it is possible to manufacture an insulated gate semiconductor device which uses small consumption power, which has a large RBSOA and which is highly reliable, at an inexpensive cost without complex manufacturing steps.

In the method of manufacturing an insulated gate semiconductor device which is constructed as defined in the eleventh aspect of the present invention, it is possible to manufacture an insulated gate semiconductor device in which an additional area to the interlayer insulation film for the sake of aligning a mask is small, cell intervals are small, consumption power is small, an RBSOA is large, and the reliability is high, at an inexpensive cost without complex manufacturing steps.

In the method of manufacturing an insulated gate semiconductor device which is constructed as defined in the twelfth aspect of the present invention, the interlayer insulation film does not cover the link portions of the fourth semiconductor layers, which separate the exposed surface of the fifth semiconductor layer which are located between adjacent inner walls. The link portions of the fourth semiconductor layers and the fifth semiconductor layer allow the first major electrode to create a contact between the third and the fourth semiconductor layers. Hence, it is possible to manufacture an insulated gate semiconductor device in which cell intervals are small, at an inexpensive cost without complex manufacturing steps.

In the method of manufacturing an insulated gate semiconductor device which is constructed as defined in the thirteenth aspect of the present invention, the fourth semiconductor layers which are sandwiched between the fifth semiconductor layer and the inner walls serve as a resistance between the fourth semiconductor layers which contact the first major electrode. When a large current flows, the resistance induces a voltage drop within the fourth semiconductor layers. Hence, it is possible to manufacture a small, dense and reliable insulated gate semiconductor device in which a parasitic transistor does not easily turn on and an RBSOA is large, at an inexpensive cost without complex manufacturing steps.

In the method of manufacturing an insulated gate semiconductor device which is constructed as defined in the fourteenth aspect of the present invention, the exposed surface of the third semiconductor layer is formed small. The fourth semiconductor layers which are sandwiched between the third semiconductor layer and the inner walls serve as a resistance between the fourth semiconductor layers which contact the first major electrode. When a large current flows, the resistance induces a voltage drop within the fourth semiconductor layers. Hence, it is possible to manufacture a small, dense and reliable insulated gate semiconductor device in which a parasitic transistor does not easily turn on and an RBSOA is large, at an inexpensive cost without complex manufacturing steps.

Accordingly, it is an object of the present invention to provide for an insulated gate semiconductor device which has a device structure in which a parasitic transistor does not easily turn on and therefore the SOA is improved, and a method of manufacturing such a device.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
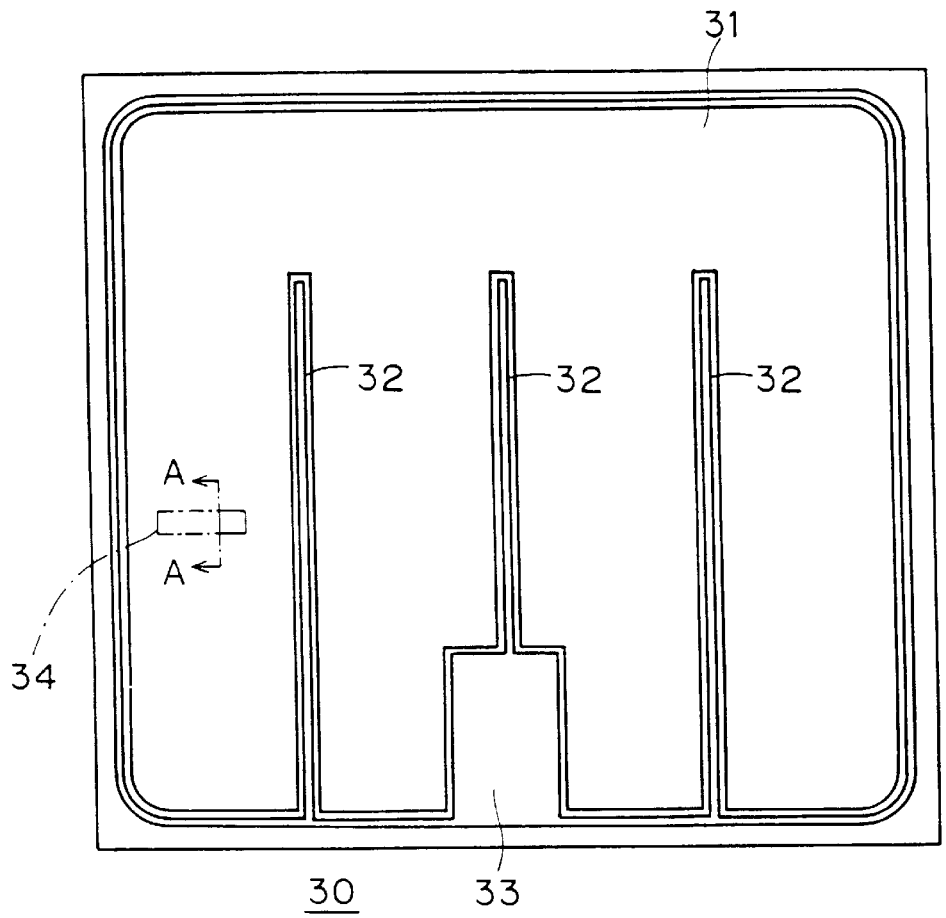
FIG. 1 is a plan view of an insulated gate semiconductor device according to a first preferred embodiment of the present invention.

FIG. 1 is a plan view of an insulated gate semiconductor device according to a first preferred embodiment of the present invention. As an example of an insulated gate semiconductor device, a U-type IGBT will be described in the following.

Figure 2:
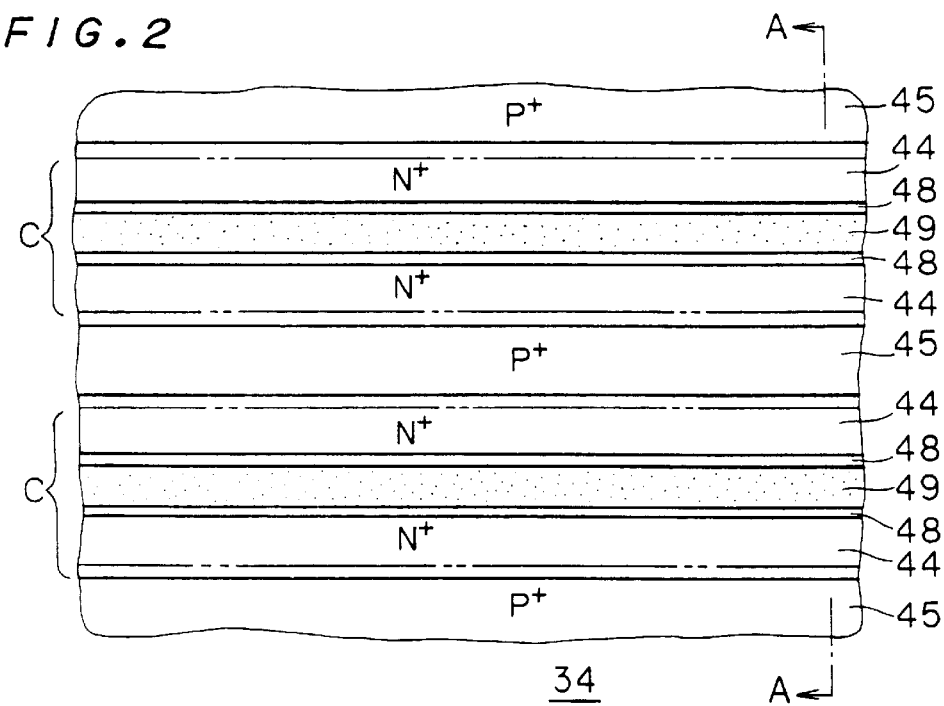
FIG. 2 is a partial plan view showing some cells of the insulated gate semiconductor device.
Figure 3:
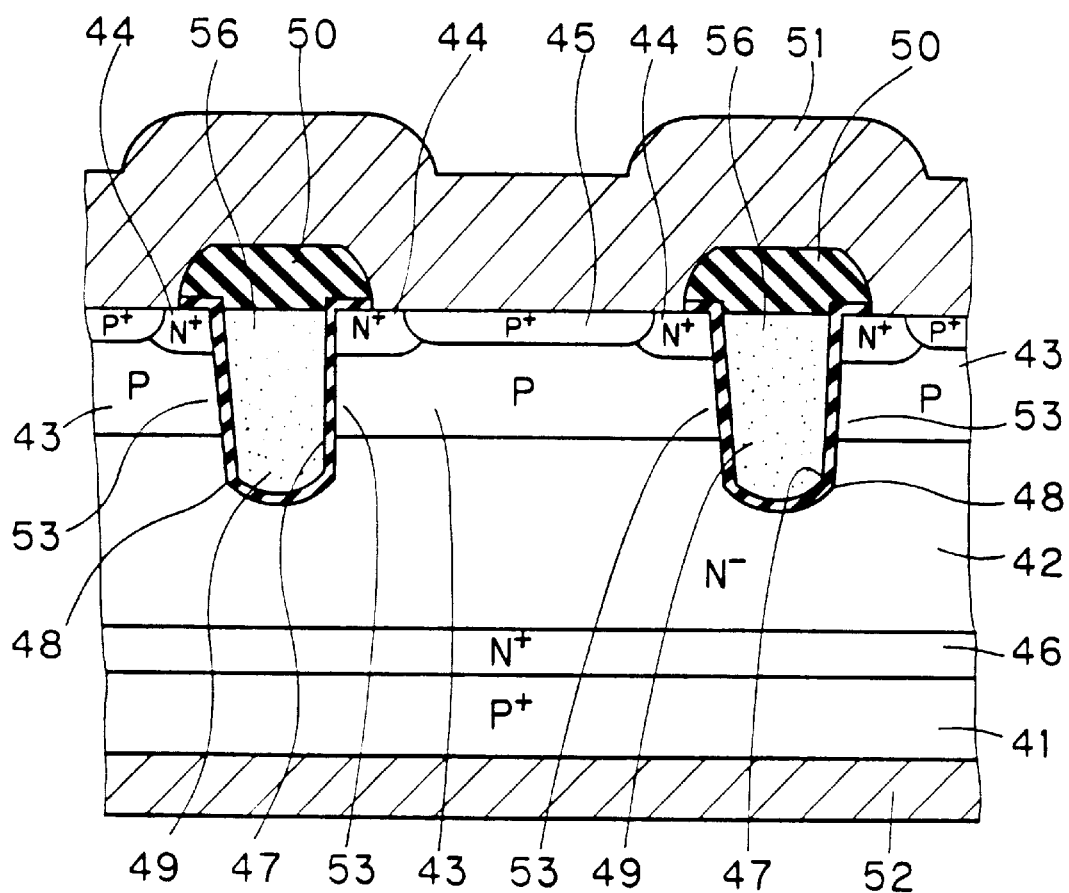
FIG. 3 is a partial cross sectional view showing some cells of the insulated gate semiconductor device taken along lines A—A.

FIG. 2 is a partial plan view showing some cells of the U-type IGBT of FIG. 1, and FIG. 3 is a partial cross sectional view showing some cells of FIG. 2 taken along lines A—A. In FIG. 2, the cells are shown as they are with an emitter electrode 51 and an interlayer insulation film 50 removed.

In FIG. 1, denoted at 30 is a U-type IGBT, denoted at 31 is an emitter electrode which functions as a first major electrode, denoted at 32 are gate lines, denoted at 33 is a gate pad, and denoted at 34 is a part of cells.

In FIGS. 2 and 3, denoted at 41 is a $P^+$ collector layer which serves as a first semiconductor layer, denoted at 42 is an $N^-$ layer which serves as a second semiconductor layer, denoted at 43 is a P base layer which serves as a third semiconductor layer, denoted at 44 are $N^+$ emitter layers which serve as a fourth semiconductor layer, denoted at 45 are $P^+$ semiconductor layers which serve as a fifth semiconductor layer, denoted at 46 is an $N^+$ buffer layer, denoted at 47 are inner walls each formed in the shape of a groove. Trenches are defined by the inner walls 47. Denoted at 48 are gate insulation films, denoted at 49 are gate electrodes each serving as a control electrode, denoted at 50 is the interlayer insulation film, and denoted at 51 is the emitter electrode which serves as the first major electrode. The emitter electrode 51 is a portion of the emitter electrode 31 of FIG. 1. Denoted at 52 is a collector electrode which serves as a second major electrode, and denoted at 53 are channel regions. Areas C defined by brackets and dashed-and-dotted lines in FIG. 2 are areas which are covered with the interlayer insulation film 50.

In other preferred embodiments which will be described later, similar reference symbols denote similar structures.

Usually, the gate insulation films 48 are thermal oxidation films of $SiO_2$, and the gate electrodes 49 are made of polysilicon doped with N-type impurities. The interlayer insulation film 50 is made of silicate glass containing boron and phosphorus (hereinafter "BPSG"). The emitter electrode 51, the gate lines 32 and the gate pad 33 are made of Al containing Si (hereinafter "Al-Si"). The collector electrode 52 is made of AlMoNiAu alloy.

The gate lines 32 are connected to the gate electrodes 49 so that polysilicon portions in paths from the gate electrodes 49 to the gate pad 33 are small so that an electric resistance from the gate electrodes 49 to the gate pad 33 is reduced and so that the element is controlled uniformly over the entire surface of the element.

In the U-type IGBT according to the present embodiment, the $N^+$ buffer layer 46 is disposed on a surface of the $P^+$ collector layer 41, and the N⁻ layer 42 is disposed on a surface of the N⁺ buffer layer 46. Further, the P base layer 43 is disposed on the N⁻ layer 42. The N⁺ emitter layers 44 are disposed on a surface of the P base layer 43 at intervals so as to form stripes. Along the longitudinal extension of the stripes of the N⁺ emitter layers 44, the trench-shaped inner walls 47 are formed, extending from surfaces of the N⁺ emitter layers 44 and penetrating into the N⁻ layer 42 through the P base layer 43.

In a surface defined by the P base layer 43 and the N⁺ emitter layers 44 which are present between two adjacent inner walls 47, the P⁺ semiconductor layers 45 are formed in such a manner that bottom surfaces of the P⁺ semiconductor layers 45 contact the P base layer 43, and partially overlap the N⁺ emitter layers 44 at both ends thereof, and that junctions between the N⁺ emitter layers 44 and the P⁺ semiconductor layers 45 are exposed to a surface.

The impurity concentration of the P⁺ semiconductor layers 45 is generally higher than that of the N⁺ emitter layers 44. If the impurity concentration of the N⁺ emitter layers 44 is set at about $1 \times (10^{18}$–$10^{19})$, the impurity concentration of the P⁺ semiconductor layers 45 is set around $2 \times (10^{18}$–$10^{19})$, i.e., about two times higher than the impurity concentration of the N⁺ emitter layers 44.

The gate insulation films 48 are disposed in the inner walls 47. The gate insulation films 48 extend up to the surfaces of the N⁺ emitter layers 44 which are adjacent to openings 56 of the inner walls 47. In each trench which is surrounded by each inner wall 47 through each gate insulation film 48, each gate electrode 49 is filled in up to each opening at the surfaces of the N⁺ emitter layers 44. Surfaces of the gate electrodes 49 are lower than surfaces of the gate insulation films 48 which are formed on the surfaces of the N⁺ emitter layers 44 which are adjacent to the openings 56 of the inner walls 47.

In FIG. 3, the surfaces of the gate electrodes 49 are flush with the surfaces of the N⁺ emitter layers 44. Although the surfaces of the gate electrodes 49 may be further recessed from the surfaces of the N⁺ emitter layers 44, to form channels, the surfaces of the gate electrodes 49 must be located at a shallower position than the bottom of the N⁺ emitters layers 44. The gate electrodes 49 are faced with the surfaces of the P base layer 43 through the gate insulation films 48. The surfaces of the P base layer 43 serve as the channel regions 53.

The surfaces of the gate electrodes 49 are covered with the interlayer insulation film 50. Through the interlayer insulation film 50, the emitter electrode 51 is disposed on a surface of the element in which the N⁺ emitter layers 44 and the P⁺ semiconductor layers 45 are formed. The N⁺ emitter layers 44 and the P base layer 43 contact the emitter electrode 51 through the P⁺ semiconductor layers 45. The gate lines 32 and the gate pad 33 which are connected to the gate electrodes 49 are disposed on the surface of the element, while insulated from the N⁺ emitter layers 44 and the P⁺ semiconductor layers 45. The collector electrode 52 is disposed on the other surface of the P⁺ collector layer 41.

If the element has a breakdown voltage on the order of 2,000 V, for example, the thickness from the surface of the element, i.e., the exposed surfaces of the P⁺ semiconductor layers 45, or from the surfaces of the N⁺ emitter layers 44 to a boundary between the N⁻ layer 42 and the N⁺ buffer layer 46 is about 200 μm, the impurity concentration of the N⁻ layer 42 is $5 \times 10^{13}$ cm⁻³, the intervals between the trench-shaped inner walls 47, i.e., the intervals between the cells are about 4 μm, and the depth of the inner walls 47 measured from the surfaces of the P⁺ semiconductor layers 45 is about 8 μm. The depth of a junction between bottom surfaces of the N⁺ emitter layers 44 and the P base layer 43 is about 1 μm, either from the N⁺ emitter layers 44 or from the surfaces of the P⁺ semiconductor layers 45. The thickness of the N⁺ buffer layer 46 is about 10 μm, and the thickness of the P⁺ collector layer 41 is about 300 μm.

Now, an operation will be described.

When a predetermined collector voltage $V_{CE}$ is applied across the emitter electrode 51 and the collector electrode 52 and a predetermined gate voltage $V_{GE}$ is applied across the emitter electrode 51 and the gate electrodes 49, that is, when gates are turned on, the channel regions 53 are inverted into the N type, thereby creating channels. Through these channels, electrons are injected into the N⁻ layer 42 from the emitter electrode 51. Injected electrons apply a forward bias across the P⁺ collector layer 41 and the N⁻ layer 42 through the N⁺ buffer layer 46 so that holes are injected into the N⁻ layer 42 from the collector electrode 52 through the P⁺ collector layer 41 and the N⁺ buffer layer 46. The conductivity is changed consequently, and the resistance of the N⁻ layer 42 is largely decreased to increase a current capacity of the IGBT.

To change the IGBT from an ON state into an OFF state, the gate voltage $V_{GE}$ applied across the emitter electrode 51 and the gate electrodes 49 is changed to 0 V or a reverse bias is applied across the emitter electrode 51 and the gate electrodes 49, thereby turning the gates off. As a result, the channel regions 53 inverted into the N type return to the P type so that injection of electrons from the emitter electrode 51 stops and injection of holes from the P⁺ collector layer 41 into the N⁻ layer 42 stops. Electrons and holes accumulated in the N⁻ layer 42 then flow into the collector electrode 52 and the emitter electrode 51, respectively, or recombine with each other to perish. Since holes can easily move within the P⁺ semiconductor layers 45 at this stage, the switching speed becomes faster.

Figure 4:
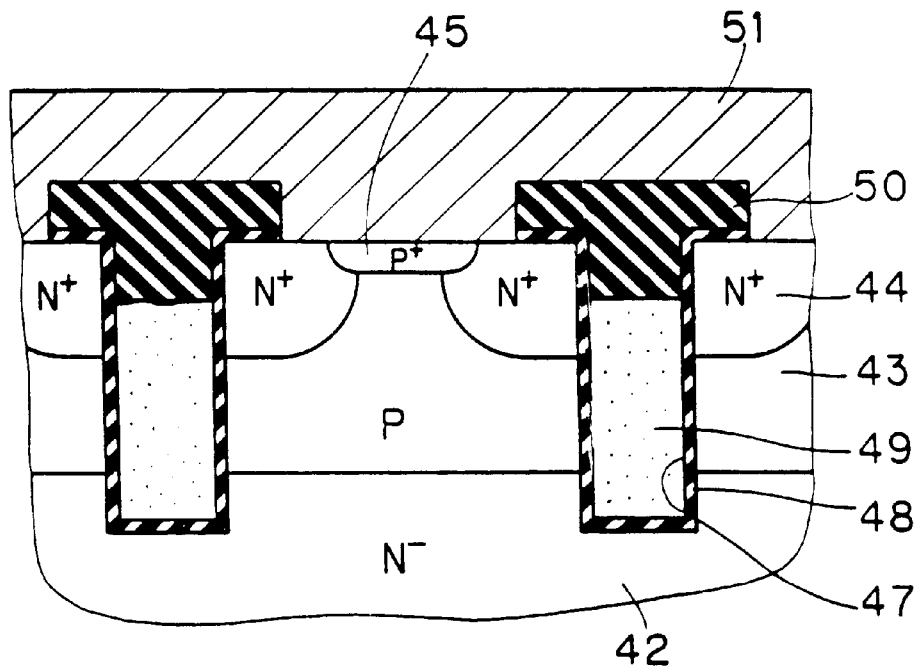
FIG. 4 is a schematic partial cross sectional view showing the present invention.

FIG. 4 is a schematic partial cross sectional view showing the present invention.

FIG. 4 describes an effect of the P⁺ semiconductor layers 45 in the present invention. The surfaces of the gate electrodes 49 are located at about half the depth of the N⁺ emitter layers 44, measured from the surfaces of the N⁺ emitter layers 44. When the surfaces of the gate electrodes 49 are located at a low position, the thickness of the N⁺ emitter layers 44 needs to be large. Since the N⁺ emitter layers 44 are formed by diffusion in most cases, when the N⁺ emitter layers 44 are formed thick, due to side diffusion, adjacent edge portions of the N⁺ emitter layers 44 which are disposed between adjacent trench-shaped inner walls 47 are positioned extremely close to each other.

This forces exposed surfaces of the P base layer 43 to be extremely small. In some cases, the adjacent edge portions of the N⁺ emitter layers 44 contact each other, thereby completely eliminating the exposed surfaces of the P base layer 43. When this happens, it is impossible for the P base layer 43 to contact the emitter electrode 51.

In conventional techniques, this problem is prevented by increasing the trench intervals. Instead, between the edge portions of the N⁺ emitter layers 44 which are positioned between the inner walls 47, the P⁺ semiconductor layers 45 are formed partially overlapping the N⁺ emitter layers 44 so that the bottom portions of the P⁺ semiconductor layers 45 contact the P base layer 43, and further, the junctions between the P⁺ semiconductor layers 45 and the N⁺ emitter layers 44 are exposed to the surface of the element. As a result, a large contact is made between the P⁺ semiconductor layers 45 and the emitter electrode 51. Hence, it is possible to reduce the trench intervals, without becoming sensitive to whether the adjacent edge portions of the $N^+$ emitter layers 44 are close to each other.

When the surfaces of the gate electrodes 49 are at a position recessed from the surfaces of the $N^+$ emitter layers 44, in particular, it is necessary to form the $N^+$ emitter layers 44 thick. Therefore, because of reduced trench intervals, the adjacent edge portions of the $N^+$ emitter layers 44 are positioned close to each other, or even may contact each other in some cases. However, even if the adjacent edge portions of the $N^+$ emitter layers 44 contact each other, since the $P^+$ semiconductor layers 45 penetrating the $N^+$ emitter layers 44 contact the P base layer 43, the P base layer 43 and the $N^+$ emitter layers 44 contact the emitter electrode 51 through the $P^+$ semiconductor layers 45.

Since the $N^+$ emitter layers 44 are formed by diffusion into the P base layer 43, the impurity concentration of the $N^+$ emitter layers 44 must be higher than that of the P base layer 43. Further, since the $P^+$ semiconductor layers 45 are diffused so as to overlap adjacent edge portions of the $N^+$ emitter layers 44, the impurity concentration of the $P^+$ semiconductor layers 45 must be higher than that of the $N^+$ emitter layers 44.

If the $P^+$ semiconductor layers 45 are formed first and the $N^+$ emitter layers 44 are then formed to have a higher impurity concentration than that of the $P^+$ semiconductor layers 45, adjacent edge portions of the $N^+$ emitter layers 44 come close to each other. As a result, the $P^+$ semiconductor layers 45 are eliminated by the $N^+$ emitter layers 44 in the present embodiment, and therefore, the effect of disposing the $P^+$ semiconductor layers 45 in the first preferred embodiment is not created.

Figure 5:
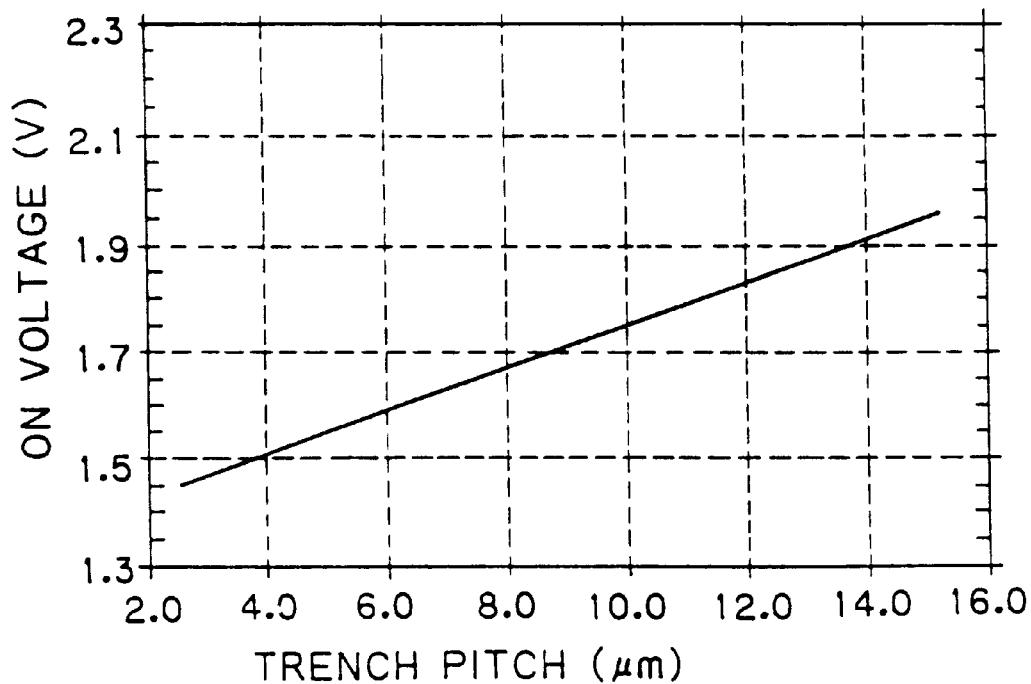
FIG. 5 is a graph showing a relationship between a trench pitch and an ON-voltage in a U-type IGBT.
Figure 6:
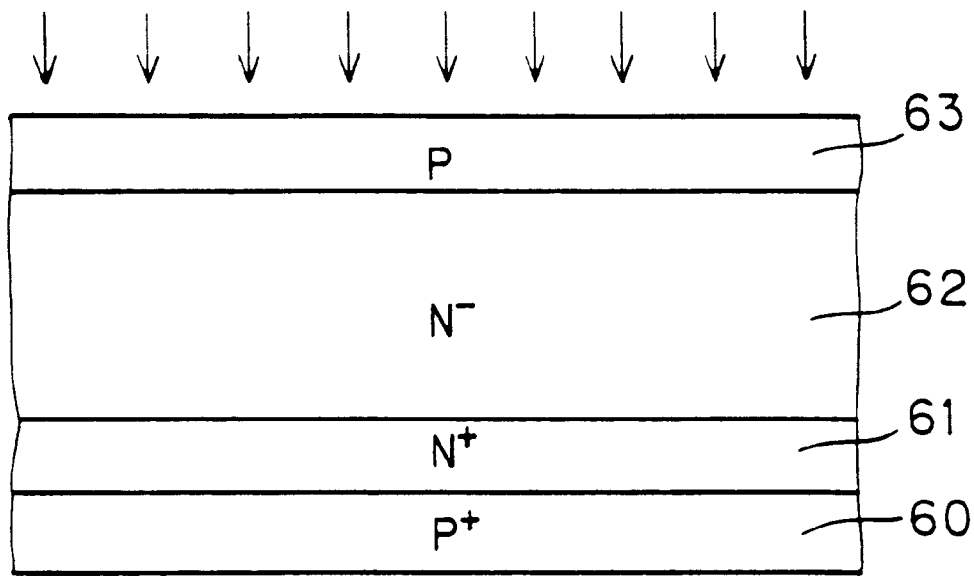
FIGS. 6 to 14 are partial cross sectional views of an element during manufacturing steps of the insulated gate semiconductor device according to the present invention.
Figure 7:
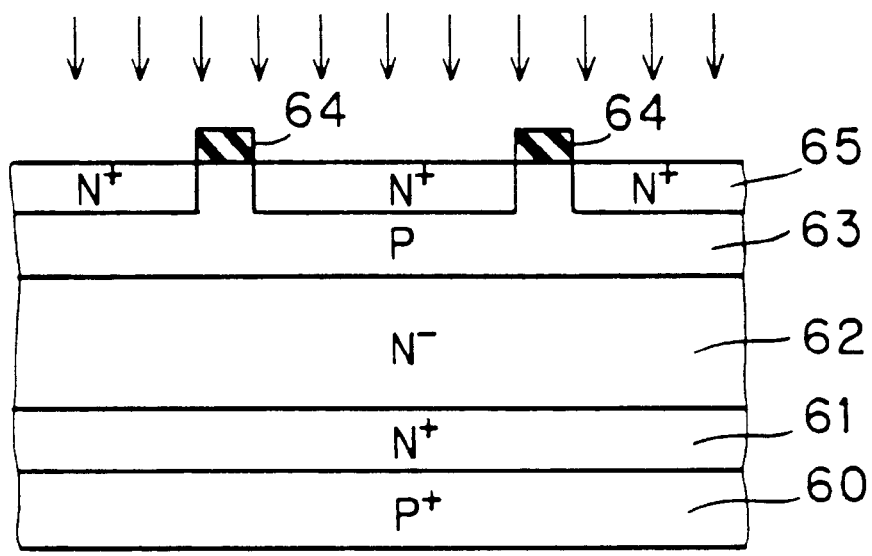
Figure 8:
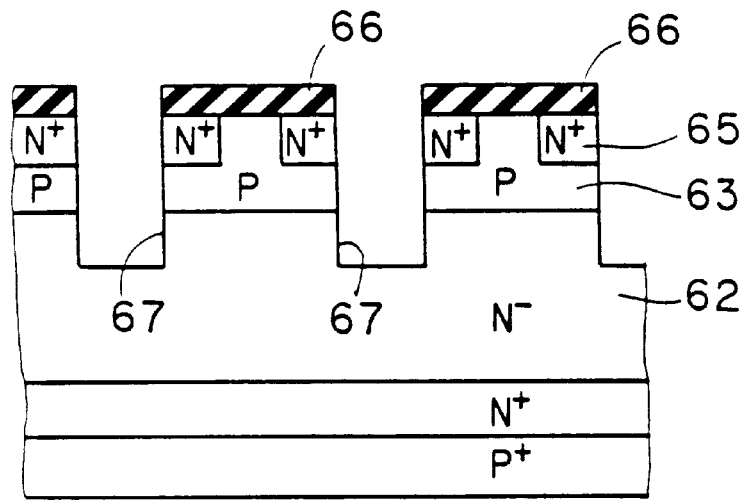
Figure 9:
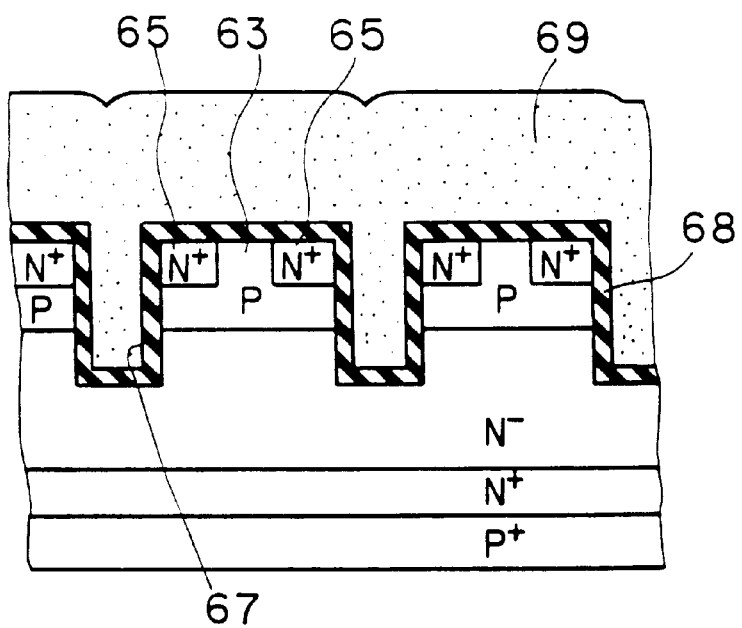

FIG. 5 is a graph showing a relationship between the trench pitch and the ON-voltage in the U-type IGBT.

As shown in FIG. 5, the smaller the trench pitch of the U-type IGBTs, the lower the ON-voltage becomes and hence the better various characteristics which affect the ON-voltage become.

In the present embodiment, since the $P^+$ semiconductor layers 45 are formed so as to overlap adjacent edge portions of the $N^+$ emitter layers 44 and so as to contact the P base layer 43, the emitter electrode 51 and the P base layer 43 contact each other through the $P^+$ semiconductor layers 45. As a result, the trench pitch and hence the ON-voltage are reduced. Further, the element becomes smaller and denser and the reliability is improved.

In addition, since the trench pitch is small, the parasitic transistor which is formed by the $N^+$ emitter regions 4, the P base layer 3 and the $N^-$ layer 2 does not easily turn on.

That is, even when the IGBT within the RBSOA is in the OFF state, electrons and holes accumulated in the $N^-$ layer 2 (the $N^+$ buffer layer 9 if the $N^+$ buffer layer 9 is disposed) flow into the collector electrode 11 and the emitter electrode 10, respectively, or recombine with each other to perish, as in the case of a change from the normal ON state into the OFF state.

In this case, when holes flow into the emitter electrode 10, if the cell size is small, the quantity of holes which flow into one cell becomes small. Since the hole current serves as a base current of the parasitic bipolar transistor, if the potential of the P base layer 3 exceeds a built-in potential (0.6 V, in general) between the P base layer 3 and the $N^+$ emitter regions 4, the parasitic bipolar transistor turns on.

However, a voltage drop becomes small since the hole current is small, and therefore, the built-in potential between the P base layer 3 and the $N^+$ emitter regions 4 is not easily reached, thereby making it difficult for the parasitic bipolar transistor to turn on. In other words, the RBSOA becomes large.

Next, an example of a manufacturing method of the U-type IGBT according to the present embodiment will be described.

FIGS. 6 to 14 are partial cross sectional views showing the element during the respective stages of manufacturing.

First, an $N^+$ layer 61 and an $N^-$ layer 62 are epitaxially grown on $P^+$ silicon substrate 60, successively. Next, P-type impurities are implanted and annealed in a surface of the $N^-$ layer 62, whereby a P base layer 63 is defined (See FIG. 6).

Following this, a resist is stacked on a surface of the P base layer 63, and through photolithographic processes, a resist pattern 64 which includes a plurality of strip-shaped openings is formed. Using the resist pattern 64 as a mask, the surface of the P base layer 63 is doped with N-type impurities to a high concentration. The resist pattern 64 is thereafter removed. The impurities are annealed and diffused to define $N^+$ emitter regions 65 (See FIG. 7).

An oxide film 66 which serves as a shielding film is then formed on a surface of the P base layer 63 and the $N^+$ emitter regions 65. On surfaces of the $N^+$ emitter regions 65, a silicon etching mask is formed which includes a strip-like shaped opening which has a narrower width than the $N^+$ emitter regions 65, using the oxide film 66. Using the silicon etching mask, RIE (Reactive Ion Etching) is performed, thereby defining trench-shaped inner walls 67 which extend from the surfaces of the $N^+$ emitter regions 65 and penetrate into the $N^-$ layer 62 (See FIG. 8). The oxide film 66 is then removed by etching.

Next, a thermal oxidation film 68 which serves as an insulation film is formed on surfaces of the inner walls 67, a surface of the P base layer 63 and the surfaces of the $N^+$ emitter regions 65. Electrically conductive polysilicon 69 doped with N-type impurities is stacked on the thermal oxidation film 68, whereby the grooves formed by the inner walls 67 are filled up (See FIG. 9).

Figure 10:
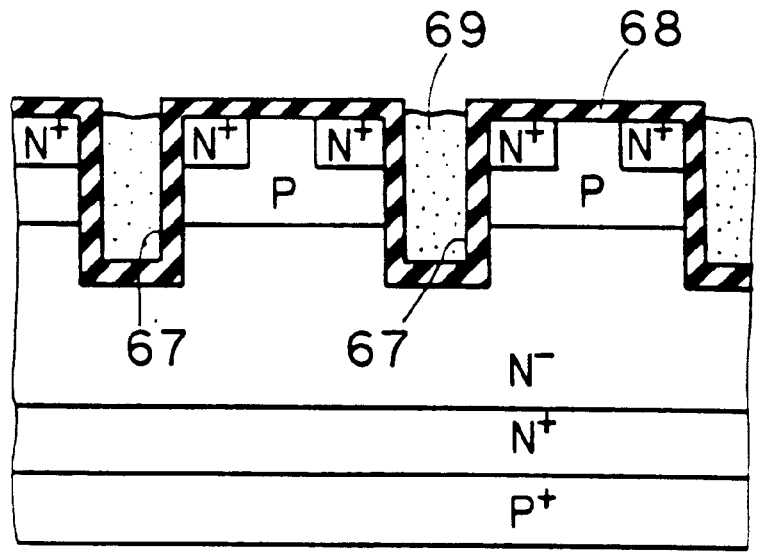
Figure 11:
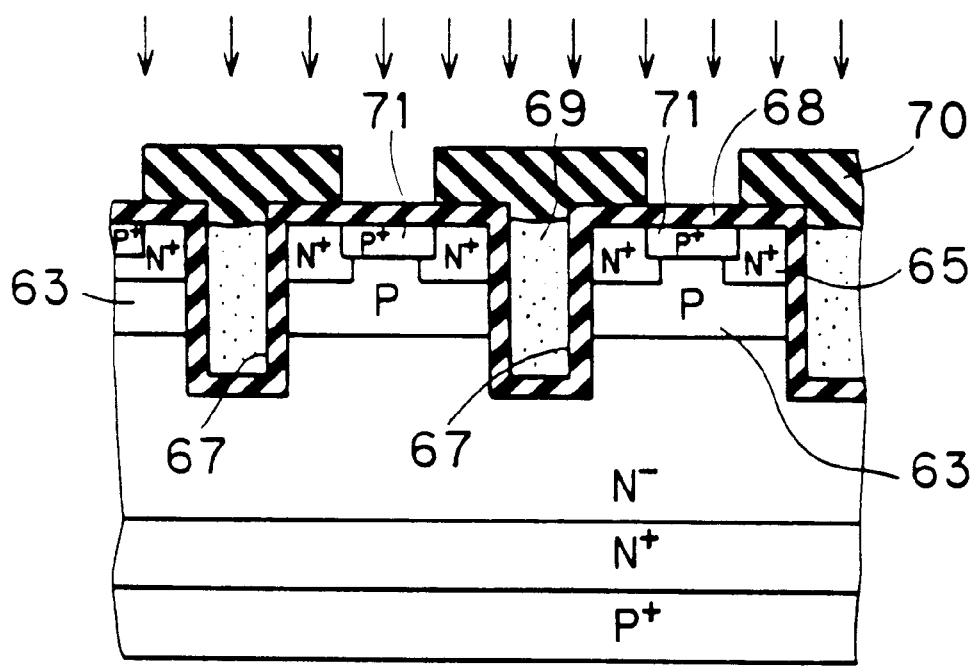

The stacked polysilicon 69 is then etched back so that a surface of the polysilicon 69 filling up the grooves formed by the inner walls 67 is recessed from a surface of the thermal oxidation film 68 which is formed on the surfaces of the $N^+$ emitter regions 65 (See FIG. 10). Etching back must be performed so that the surface of the polysilicon 69 is positioned at a shallower position than the bottom of the $N^+$ emitter regions 65.

A resist 70 is then stacked on the surface of the polysilicon 69 filling up the grooves formed by the inner walls 67 and on the surface of the thermal oxidation film 68. In the resist 70, an opening is formed by photolithographic processes to surround the surface of the P base layer 63 and portions of the $N^+$ emitter regions 65 which are adjacent to the P base layer 63 and which extend along the inner walls 67, whereby a resist pattern is obtained. Using the resist pattern as a mask, P-type impurities are implanted through the thermal oxidation film 68, at a higher impurity concentration than that of the $N^+$ emitter regions 65. The resist pattern is thereafter removed. By a thermal process, the P-type impurities are diffused shallower than the bottom of the $N^+$ emitter regions 65, to define a $P^+$ semiconductor layer 71 whose bottom surface contacts the P base layer 63 (See FIG. 11).

Figure 12:
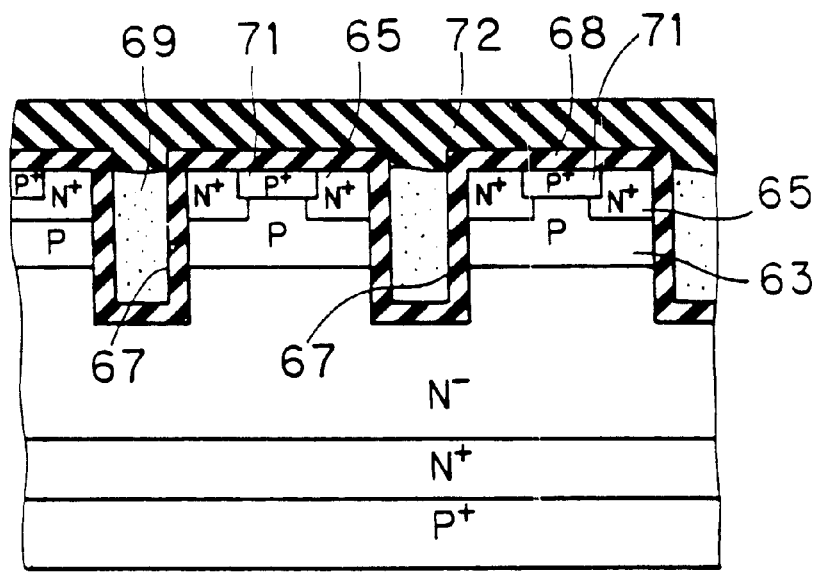

Next, a BPSG 72 which serves as an insulation is stacked on the surface of the polysilicon 69 filling up the grooves formed by the inner walls 67 and on the surface of the thermal oxidation film 68 (See FIG. 12).

Following this, a resist 73 is stacked on a surface of the BPSG 72. In the resist 73, an opening is formed by photolithographic processes which surrounds the $P^+$ semiconductor layer 71 and portions of the $N^+$ emitter regions 65 which are adjacent to the P+ semiconductor layer 71 and which extend along the inner walls 67, whereby a resist pattern is obtained. Using the resist pattern as a mask, the BPSG 72 and the thermal oxidation film 68 are etched so that an interlayer insulation film 72 is formed on the surface of the polysilicon 69 filling up the grooves formed by the inner walls 67 (See FIG. 13). The resist pattern is thereafter removed.

To short-circuit the P+ semiconductor layer 71 and the N+ emitter regions 65 which are exposed by etching, Al-Si is stacked which serves as a conductive layer on a surface of the element in which the P+ semiconductor layer 71, the N+ emitter regions 65 and the interlayer insulation film 72 are formed. This creates a gate line and a gate pad at the same time which are connected to the polysilicon 69 which is buried in the grooves which are defined by the emitter electrode 73 and the inner walls 67 (See FIG. 14).

Further, AlMoNiAu alloy which serves as a conductive layer is stacked on the surface of the P+ silicon substrate 60, thereby forming a collector electrode 75.

Through such manufacturing processes, the U-type IGBT according to the present embodiment is manufactured at an inexpensive cost.

Second Preferred Embodiment

Figure 15:
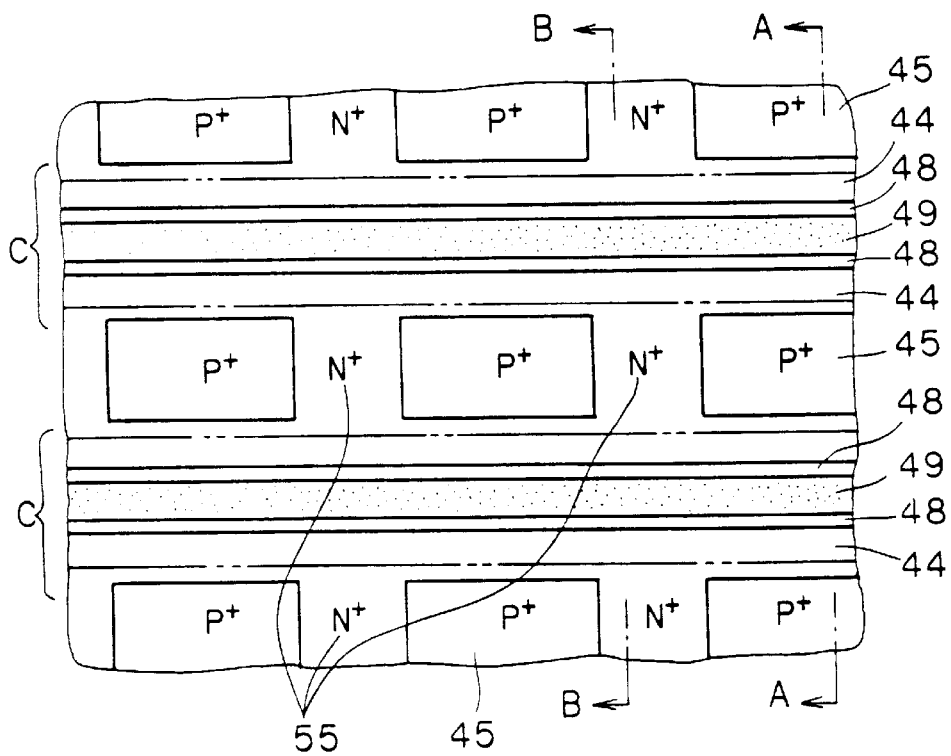
FIG. 15 is a partial plan view of an insulated gate semiconductor device according to another preferred embodiment of the present invention.
Figure 16:
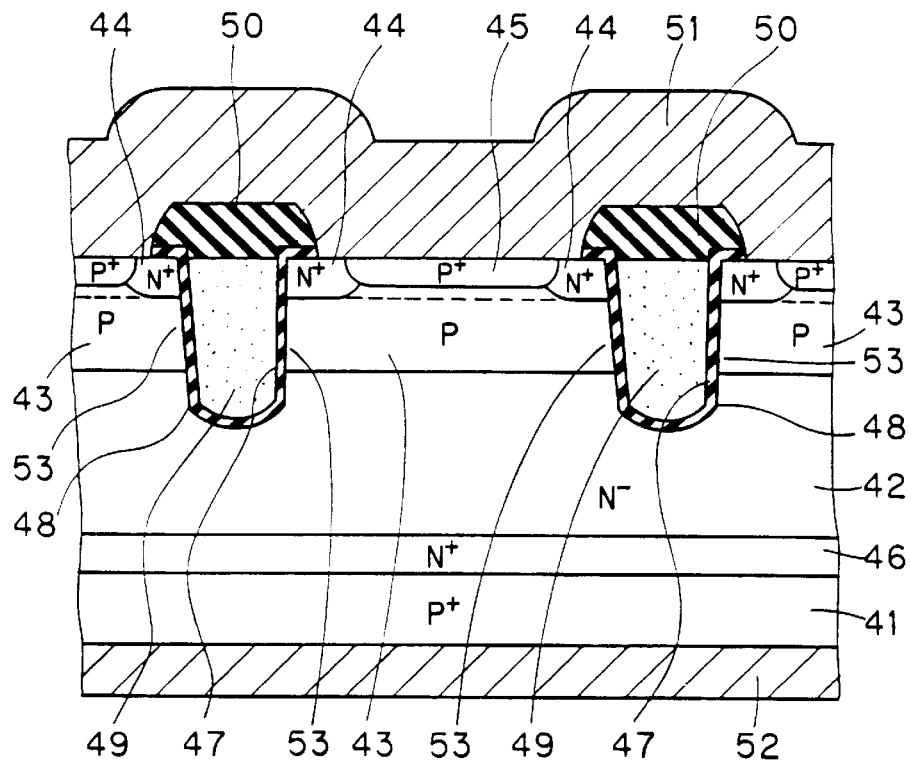
FIG. 16 is a partial cross sectional view of the insulated gate semiconductor device according to another preferred embodiment of the present invention, taken along lines A—A.
Figure 17:
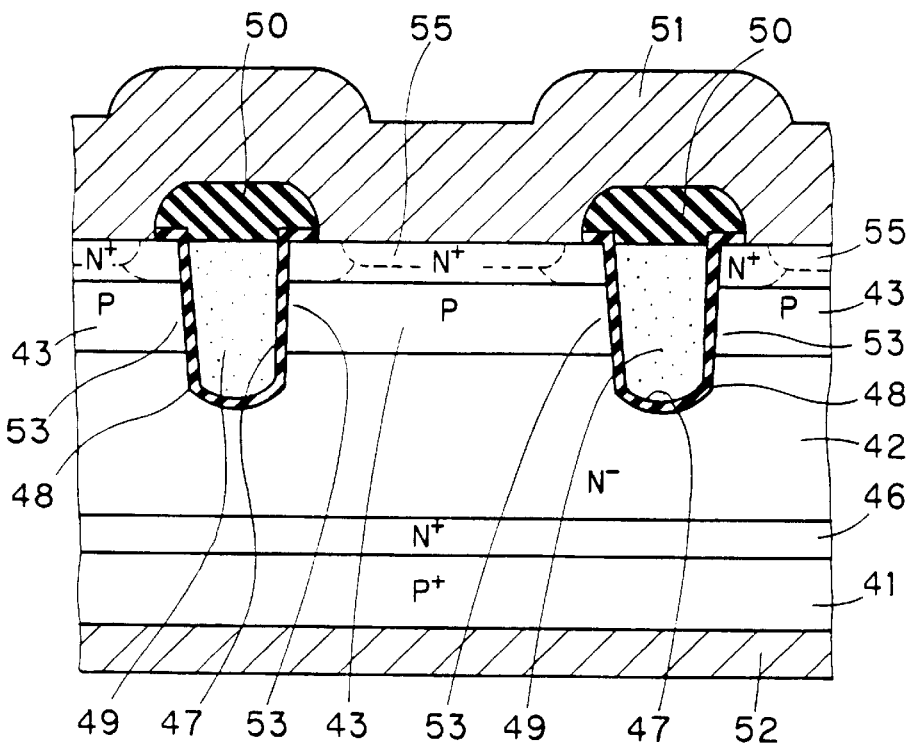
FIG. 17 is a partial cross sectional view of the insulated gate semiconductor device according to another preferred embodiment of the present invention, taken along lines B—B.

FIG. 15 is a partial plan view of an insulated gate semiconductor device according to another preferred embodiment of the present invention, FIG. 16 is a partial cross sectional view of some cells of FIG. 15 taken along lines A—A, and FIG. 17 is a partial cross sectional view of some cells of FIG. 15 taken along lines B—B. In FIG. 15, the cells are shown as they are with the emitter electrode 51 and the interlayer insulation film 50 removed. Areas C defined by brackets and dashed-and-dotted lines in FIG. 15 are areas which are covered with the interlayer insulation film 50.

In FIGS. 15, 16 and 17, in the U-type IGBT according to the present embodiment, the N+ emitter layers 44 which are formed between the groove-shaped inner walls 47 have a ladder-like plan configuration. In other words, the N+ emitter layers 44 are arranged in the shape of strips, sandwiching the exposed surfaces of the P+ semiconductor layers 45. The groove-shaped inner walls 47 including openings at the surfaces of the N+ emitter layers 44 extend along the longitudinal direction of the N+ emitter layers 44. Adjacent N+ emitter layers 44 which are disposed between the gate electrodes 49 which are buried in the inner walls are connected to each other through link portions 55. The exposed surfaces of the P+ semiconductor layers 45 and the link portions 55 are disposed alternately.

The area C of the interlayer insulation film 50 covers the gate electrodes 49 and extends over adjacent N+ emitter layers 44 which are adjacent to and along the groove-shaped inner walls 47, but does not extend over the exposed surfaces of the P+ semiconductor layers 45.

The illustrative U-type IGBT is otherwise similar in structure to the U-type IGBT according to the first preferred embodiment.

Figure 13:
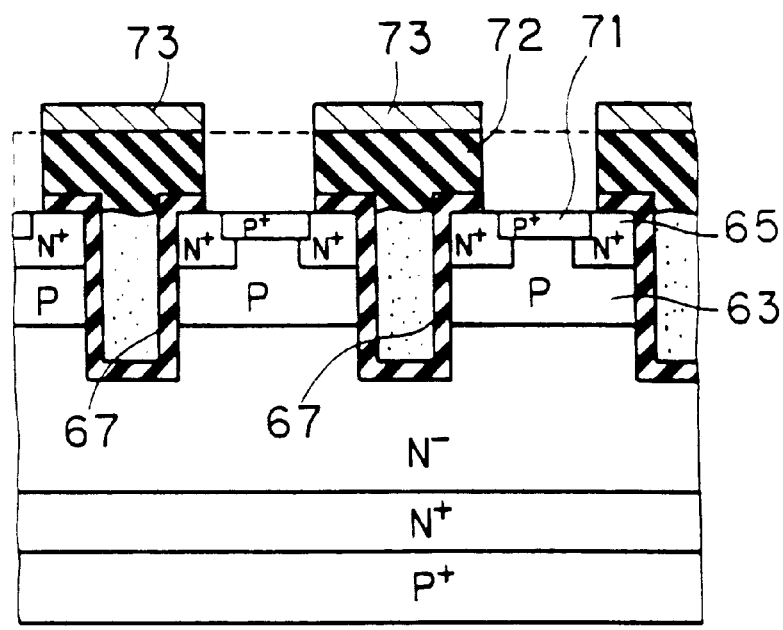
Figure 14:
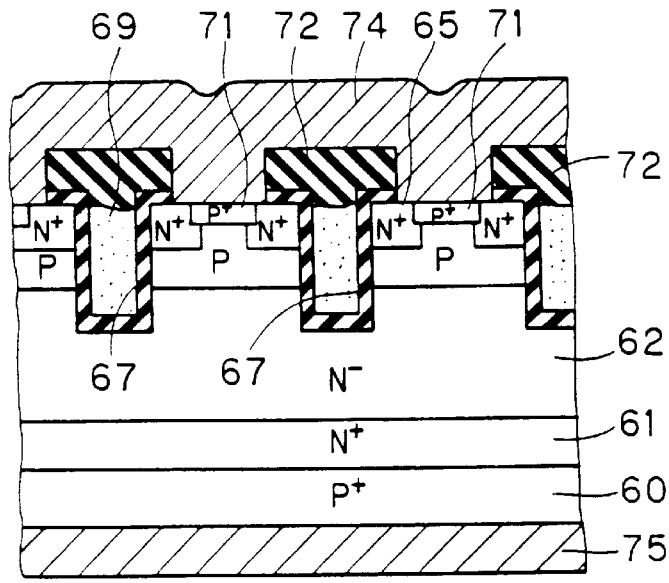

Since the plan configuration of the N+ emitter layers 44 is a ladder-like configuration, a contact area at which the emitter electrode 51 contacts the N+ emitter layers 44 is ensured by the link portions 55 as well, which eliminates the necessity to additionally create an additional contact area to deal with misalignment of masks. That is, since it is not necessary to ensure an additional area to deal with misalignment of masks when the emitter electrode 73 shown in FIG. 13 is formed and since the cell intervals can be reduced accordingly, as compared in the structure in which the N+ emitter layers 44 are disposed simply to extend along the gate electrodes 49 as shown in FIG. 2, it is possible for the cells to have fine geometry. Further, it is possible to arrange contact areas in a good balance all over the element.

Hence, the element is formed denser and to have a low ON-voltage. It is possible to unify operation characteristics of the respective cells all over the element.

In addition, when the plan configuration of the N+ emitter layers 44 is a ladder-like configuration, the P+ semiconductor layers 45 are not formed, and the exposed surfaces of the P base layer 43 are simply formed, the thicker the N+ emitter layers 44 become, the wider the link portions 55 of the N+ emitter layers 44 become due to diffusion in the horizontal direction, whereby the quantity of a hole current which flows immediately below the link portions 55 becomes large. Since the holes serve as a base current for the parasitic transistor which is formed by the N+ emitter regions 44, the P base layer 43 and the N− layer 42, the parasitic transistor is easily turned on. However, since the P+ semiconductor layers 45 are disposed which restrict the diffusion of the link portions 55 in the direction of the width of the link portions 55, the parasitic transistor does not tend to turn on. Hence, it is possible to prevent a reduction of the RBSOA.

As compared with the manufacturing processes according to the first preferred embodiment, the manufacturing processes according to the present embodiment use a different resist pattern to form the N+ emitter regions 65. In the manufacturing processes according to the present embodiment, the resist is stacked on the surface of the P base layer 63, the plurality of the openings which are in the shape of parallel strips and the openings which are linked to these openings are formed by photolithographic processes, the resist pattern in which resists are left scattered in the shape of columns is formed, and using this resist pattern 64 as a mask, N-type impurities are implanted into the surface of the P base layer 63 at a high doping concentration and diffused by annealing to thereby define the N+ emitter regions 65.

Further, unlike in the manufacturing processes according to the first preferred embodiment, after etching back the polysilicon 69, the P+ semiconductor layers 71 are formed using a resist pattern which has a different shape. In a resist, openings are formed in correspondence with the exposed surfaces of the P base layers 63 which are formed on the N+ emitter regions 65 in a scattered configuration. Using such a resist as a resist pattern, impurities are implanted and then diffused by thermal processing, to thereby define the P+ semiconductor layers 71.

Third Preferred Embodiment

Figure 18:
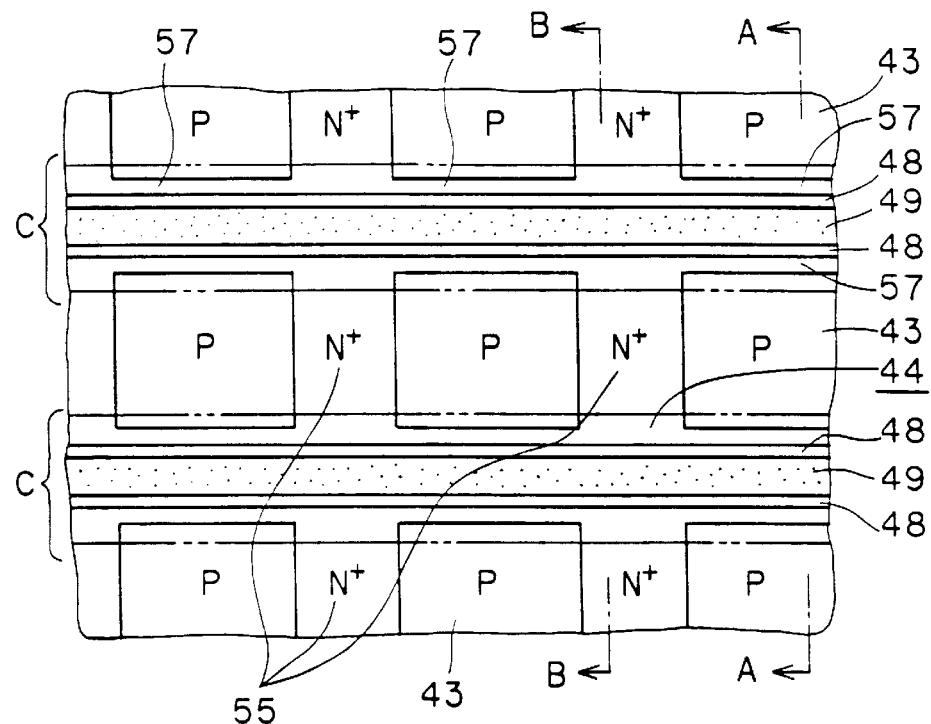
FIG. 18 is a partial plan view of an insulated gate semiconductor device according to still another preferred embodiment of the present invention.
Figure 19:
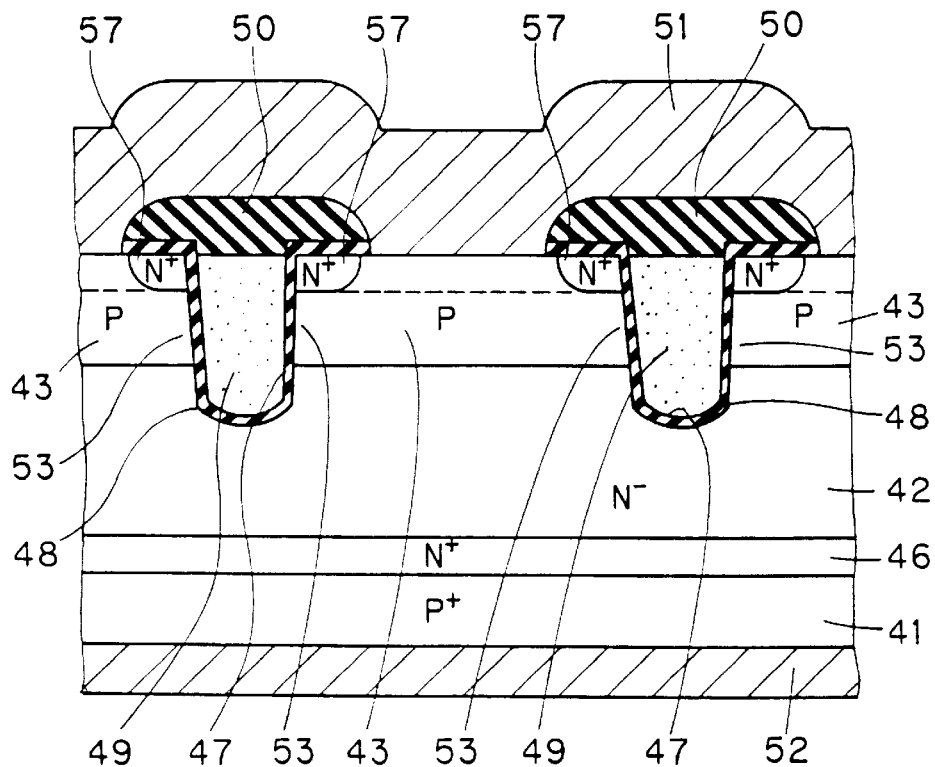
FIG. 19 is a partial cross sectional view of the insulated gate semiconductor device according to still another preferred embodiment of the present invention, taken along lines A—A.
Figure 20:
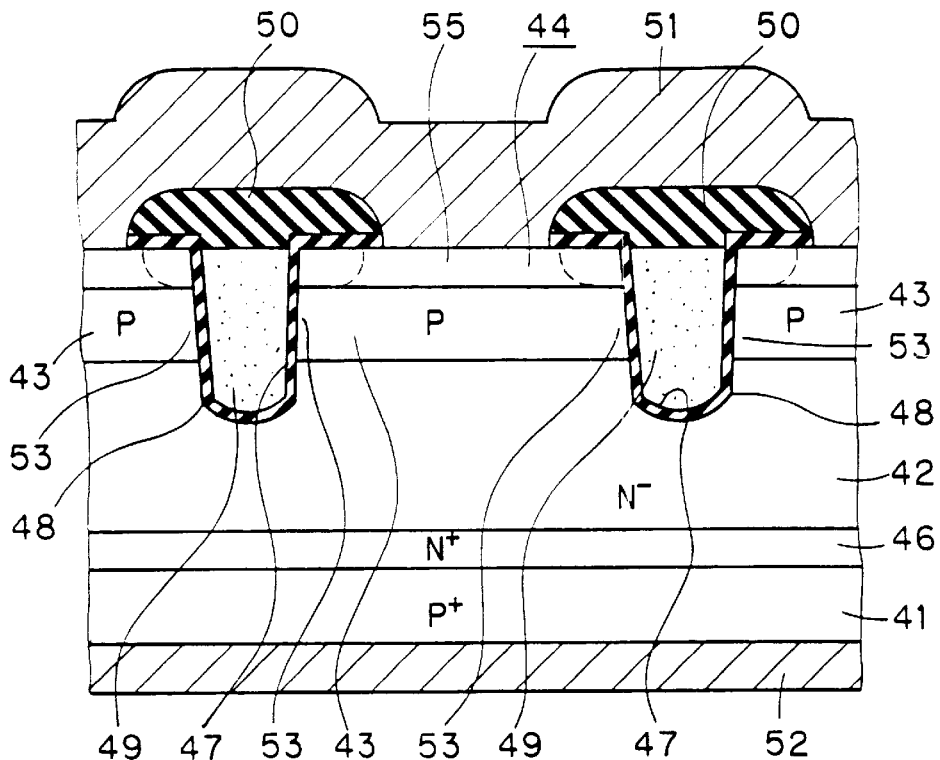
FIG. 20 is a partial cross sectional view of the insulated gate semiconductor device according to still another preferred embodiment of the present invention, taken along lines B—B.

FIG. 18 is a partial plan view of a U-type IGBT according to still another preferred embodiment of the present invention, FIG. 19 is a partial cross sectional view of some cells of FIG. 18 taken along lines A—A, and FIG. 20 is a partial cross sectional view of some cells of FIG. 18 taken along lines B—B. In FIG. 18, the cells are shown as they are with the emitter electrode 51 and the interlayer insulation film 50 removed. Areas C defined by brackets and dashed-and-dotted lines in FIG. 18 are areas which are covered with the interlayer insulation film 50.

In FIGS. 18, 19 and 20, in the U-type IGBT according to the present embodiment, the N+ emitter layers 44 which are formed between the groove-shaped inner walls 47 have a ladder-like plan configuration. In this embodiment, the P+ semiconductor layers 45 are not disposed. Exposed surfaces of the P base layer 43 are formed in a scattered configuration in the N+ emitter layers 44 which are present between the inner walls 47, along the longitudinal extension of the inner walls 47.

That is, the N⁺ emitter layers 44 are arranged in the shape of strips, sandwiching the exposed surfaces of the P base layer 43. The groove-shaped inner walls 47, which include openings at the surfaces of the N⁺ emitter layers 44, extend along the longitudinal extension of the N⁺ emitter layers 44. Adjacent N⁺ emitter layers 44, which are disposed between the gate electrodes 49 which are buried in the inner walls, are connected to each other through the link portions 55. The exposed surfaces of the P base layer 43 and the link portions 55 are disposed alternately.

The areas C of the interlayer insulation film 50 cover the gate electrodes 49, the N⁺ emitter layers 44 which are adjacent to and along the groove-shaped inner walls 47, and further extend over the P base layer 43 which is in the vicinity of the N⁺ emitter layers 44.

Hence, the emitter electrode 51 contacts the link portions 55 linking the N⁺ emitter layers 44 and the exposed surfaces of the P base layer 43, alternately. However, between the link portions 55 which are arranged in a scattered configuration, the N+emitter layers 44 which are sandwiched by the exposed surfaces of the P base layer 43 and the groove-shaped inner walls 47 are covered with the interlayer insulation film 50. Hence, these N⁺ emitter layers 44 do not contact the emitter electrode 51. The N⁺ emitter layers 44 which are sandwiched by the exposed surfaces of the P base layer 43 and the groove-shaped inner walls 47 therefore serve as emitter resistance regions 57. This means that emitter resistances are interposed, associated with the emitter electrode.

Next, an operation according to the present embodiment will be described.

Since emitter resistance values of the emitter resistance regions 57 which are sandwiched by the exposed surfaces of the P base layer 43 and the groove-shaped inner walls 47 are small, when a current as small as a rated current flows, the emitter resistances of the emitter resistance regions 57 are almost non-existent. Alternatively, the emitter resistance regions 57 are formed so as to have such emitter resistance values which do not change $V_{CE}(sat)$.

However, even if the emitter resistances are determined not to change $V_{CE}(sat)$, when a large current flows as in shorting, as far as emitter resistances are disposed, a voltage drop occurs at the N⁺ emitter layers 44 as well. Such a voltage drop functions to eliminate a voltage difference between the P base layer 43 and the N⁺ emitter layers 44.

In short, such a voltage drop functions to prevent the built-in potential (0.6 V, in general) of the parasitic transistor which is formed by the N⁺ emitter regions 44, the P base layer 43 and the N⁻ layer 42 from getting exceeded, thereby making it difficult for the parasitic transistor to turn on. Hence, the RBSOA is large.

Another current characteristic which is associated with destruction of the element is $I_C(sat)$. When shorting occurs, for instance, that is, the IGBT turns on while a high voltage is applied to the IGBT, a current which flows in the IGBT changes depending on $I_C(sat)$.

Heat which is generated during short-circuit condition is determined by:

Applied Voltage×Current Flowing in IGBT×Short-circuit Condition Time

When the IGBT reaches at a certain temperature because of such generated heat, the IGBT is destroyed.

Meanwhile, it is known that $I_C(sat)$ becomes smaller if an emitter resistance is disposed. In the present embodiment, the emitter resistance regions 57 are formed within a simple structure in which the interlayer insulation film 50 covers the N⁺ emitter regions 44 which are sandwiched by the exposed surfaces of the P base layer 43 and the groove-shaped inner walls 47, and a breakdown characteristic during short-circuit condition is improved due to the emitter resistances.

The manufacturing processes according to the present embodiment are different from the manufacturing processes according to the second preferred embodiment in that the step of forming the P⁺ semiconductor layers 71 is omitted, and in that the openings surrounding the link portions linking the P base layers 63 and the N⁺ emitter regions 65 are formed in the resist 73 which is stacked during the step of forming the interlayer insulation film, at areas except for portions of the N⁺ emitter regions 65 which extend along the inner walls 67 and except for portions of the exposed surfaces of the P base layers 63 which are partially close to the N⁺ emitter regions 65, to thereby obtain a resist pattern.

Fourth Preferred Embodiment

Figure 21:
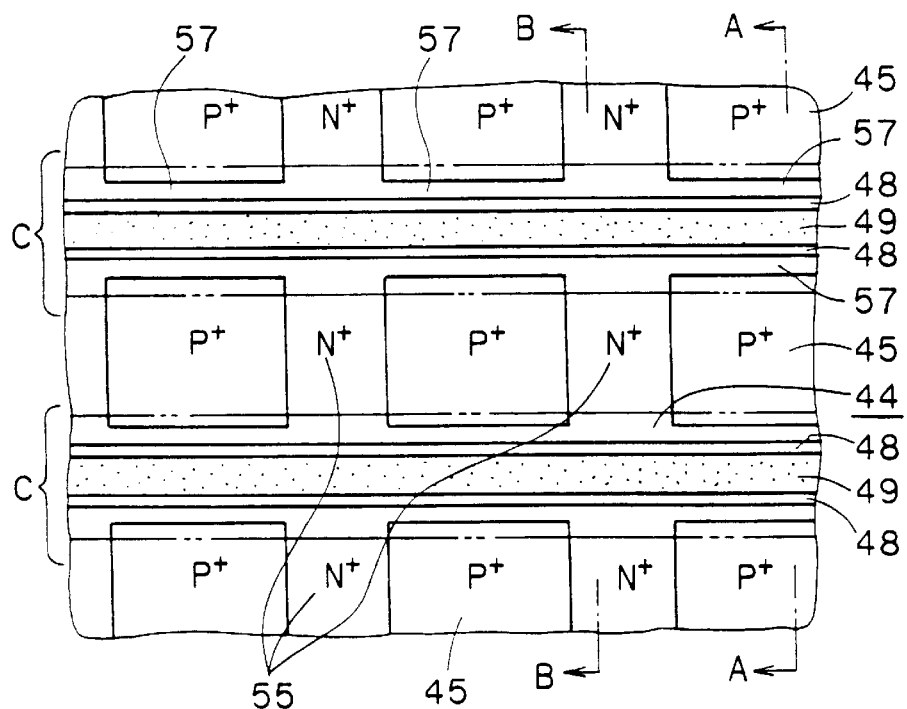
FIG. 21 is a partial plan view of an insulated gate semiconductor device according to other preferred embodiment of the present invention.
Figure 22:
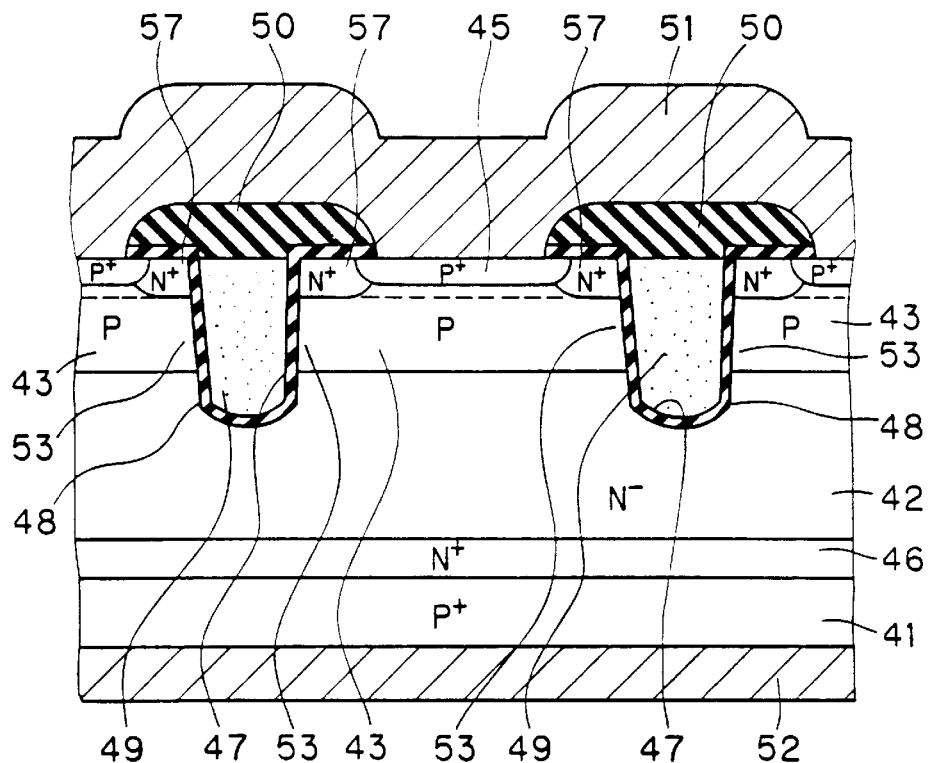
FIG. 22 is a partial cross sectional view of the insulated gate semiconductor device according to other preferred embodiment of the present invention, taken along lines A—A.
Figure 23:
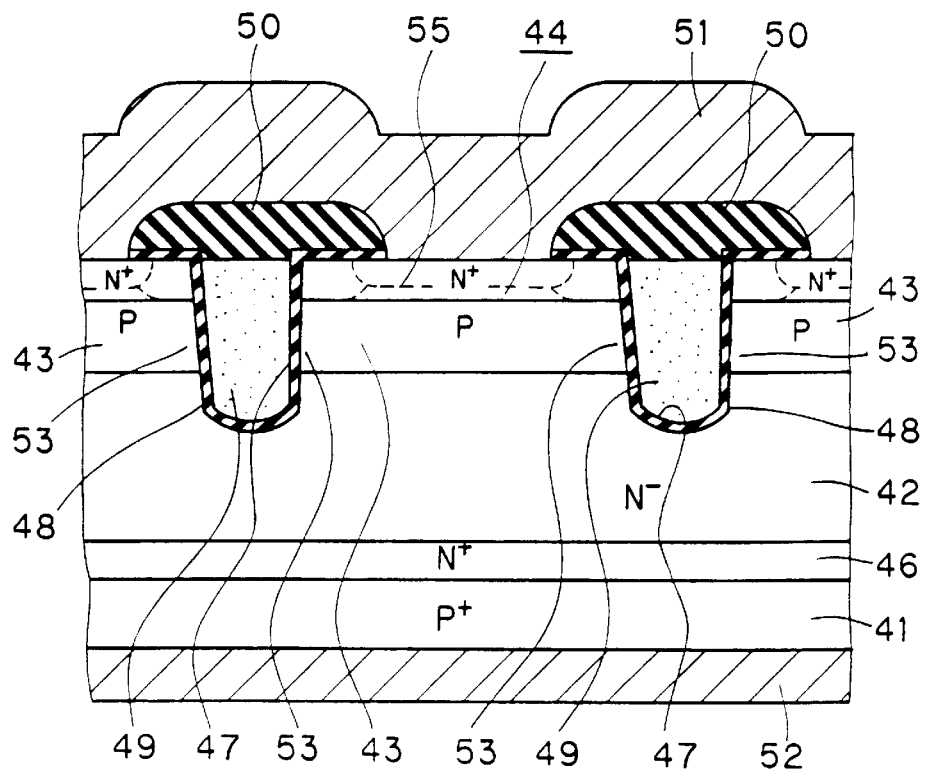
FIG. 23 is a partial cross sectional view of the insulated gate semiconductor device according to other preferred embodiment of the present invention, taken along lines B—B.

FIG. 21 is a partial plan view of a U-type IGBT according to still another preferred embodiment of the present invention, FIG. 22 is a partial cross sectional view of some cells of FIG. 21 taken along lines A—A, and FIG. 23 is a partial cross sectional view of some cells of FIG. 21 taken along lines B—B. In FIG. 21, the cells are shown as they are with the emitter electrode 51 and the interlayer insulation film 50 removed. Areas C defined by brackets and dashed-and-dotted lines in FIG. 21 are areas which are covered with the interlayer insulation film 50.

In FIGS. 21, 22 and 23, in the U-type IGBT according to the present embodiment, the N⁺ emitter layers 44 which are formed between the groove-shaped inner walls 47 have a ladder-like plan configuration. That is, the N⁺ emitter layers 44 are arranged in the shape of strips, sandwiching the exposed surfaces of the P⁺ semiconductor layers 45. The groove-shaped inner walls 47, which include openings at the surfaces of the N⁺ emitter layers 44, extend along the longitudinal extension of the N⁺ emitter layers 44. The N⁺ emitter layers 44 which are present between the gate electrodes 49 which are buried in the inner walls are connected to each other through the link portions 55. The exposed surfaces of the P⁺ semiconductor layers 45 and the link portions 55 are disposed alternately.

The areas C of the interlayer insulation film 50 cover the gate electrodes 49 and extend over adjacent N⁺ emitter layers 44 which are adjacent to and along the groove-shaped inner walls 47, and further extend over the exposed surfaces of the P⁺ semiconductor layers 45.

The emitter electrode 51 contacts the link portions 55 linking the N⁺ emitter layers 44 and the exposed surfaces of the P⁺ semiconductor layers 45, alternately. However, between the link portions 55 which are arranged in a scattered configuration, the N⁺ emitter layers 44 which are sandwiched by the exposed surfaces of the P⁺ semiconductor layers 45 and the groove-shaped inner walls 47 are covered with the interlayer insulation film 50. Hence, these N⁺ emitter layers 44 do not contact the emitter electrode 51.

The N⁺ emitter layers 44 which are sandwiched by the exposed surfaces of the P⁺ semiconductor layers 45 and the groove-shaped inner walls 47 therefore serve as the emitter resistance regions 57. This means that emitter resistances are interposed, associated with the emitter electrode.

Hence, as in the third preferred embodiment, when a large current flows as in short-circuit condition, as far as emitter resistances are disposed, a voltage drop occurs at the N⁺ emitter layers 44 as well. Such a voltage drop functions to eliminate a voltage difference between the P base layer 43 and the N⁺ emitter layers 44.

That is, such a voltage drop functions to prevent the built-in potential (0.6 V, in general) of the parasitic transistor which is formed by the N⁺ emitter regions 44, the P base layer 43 and the N⁻ layer 42 from getting exceeded, thereby making it difficult for the parasitic transistor to turn on. Hence, the RBSOA is large.

Further, as in the third preferred embodiment, the emitter resistance regions 57 are formed within a simple structure in which the interlayer insulation film 50 covers the N⁺ emitter regions 44 which are sandwiched by the exposed surfaces of the P base layer 43 and the groove-shaped inner walls 47, and a breakdown characteristic during short-circuit condition is improved due to the emitter resistances.

Still further, the structure according to the present embodiment is the same as the structure according to the third preferred embodiment as it is modified to dispose the P⁺ semiconductor layers 45 in the exposed surfaces of the P base layer 43. As in the first preferred embodiment, the P⁺ semiconductor layers 45 have an impurity concentration higher than that of the N⁺ emitter regions 44. If the impurity concentration of the N⁺ emitter layers 44 is set at about $1 \times (10^{18}-10^{19})$, the impurity concentration of the P⁺ semiconductor layers 45 is set around $2 \times (10^{18}-10^{19})$, i.e., about two times higher than the impurity concentration of the N⁺ emitter layers 44.

When diffusion of N⁺ impurities in the horizontal direction during formation of the N⁺ emitter layers 44 is insufficient or when the gate contact margin is not formed sufficiently large during formation of the interlayer insulation film 50, the adjacent edge portions of the N⁺ emitter layers 44 which are disposed between adjacent trench-shaped inner walls 47 are positioned extremely close to each other. To avoid this, there has been no conventional way but to increase the trench intervals. However, even in such a case, since the P⁺ semiconductor layers 45 are disposed between the adjacent edge portions of the N⁺ emitter layers 44, the N⁺ emitter layers 44 and the P base layer 43 contact each other through the P⁺ semiconductor layers 45 and the emitter electrode. Since this reduces the trench intervals, the parasitic transistor does not easily turn on. The ON-voltage is reduced and the density of the element is increased.

Further, according to the present embodiment, the emitter resistance regions 57 are formed within a simple structure in which the diffusion regions of the P⁺ semiconductor layers 45 are expanded, and that the N⁺ emitter layers 44, which are sandwiched between the exposed surfaces of the P⁺ semiconductor layers 45 and the groove-shaped inner walls 47, are covered with the interlayer insulation film 50. Therefore, the breakdown characteristic during shorting is improved without creating a space for disposing emitter resistances and without increasing the cell size.

In addition, the P⁺ semiconductor layers 45 are formed thinner than the N+emitter layers 44 in FIG. 22. However, according to the present embodiment, through the P⁺ semiconductor layers 45 and the emitter electrode, the contact between the N⁺ emitter layers 44 and the P base layer 43 is made within the link portions 55 of the N⁺ emitter layers 44, not within the N⁺ emitter layers 44 which are sandwiched by the exposed surfaces of the P⁺ layer 45 and the groove-shaped inner walls 47. Hence, even if the N⁺ emitter layers 44 sandwiched by the exposed surfaces of the P⁺ layer 45 and the groove-shaped inner walls 47 are formed small as a result of the side diffusion during formation of the P⁺ semiconductor layers 45, since the N⁺ emitter layers 44 only have to be large enough to form the emitter resistance regions 57, it is not always necessary to diffuse the P⁺ semiconductor layers 45 shallower than the bottom of the N⁺ emitter layers 44, considering side diffusion.

Figure 24:
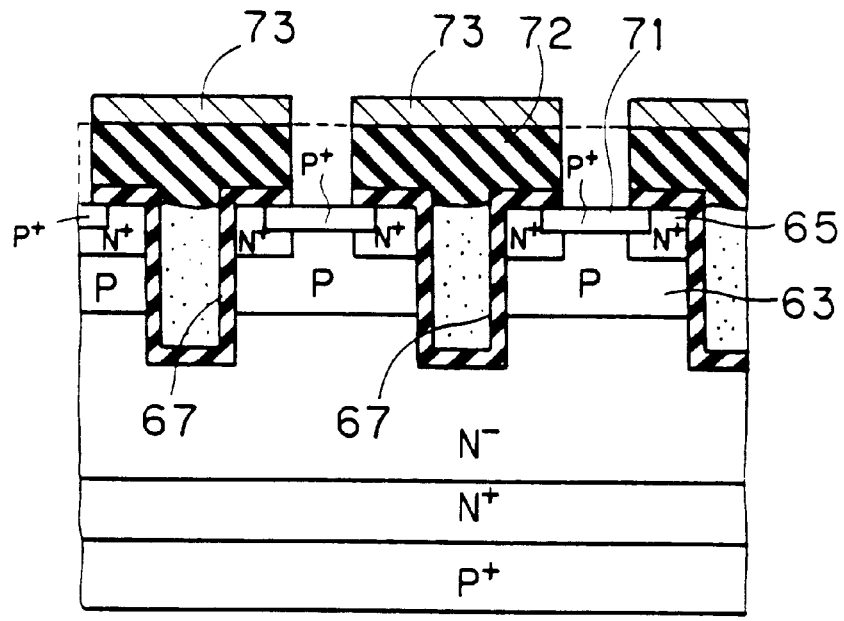
FIGS. 24 and 25 are partial cross sectional views of an element during manufacturing steps of the insulated gate semiconductor device according to the other preferred embodiment of the present invention.
Figure 25:
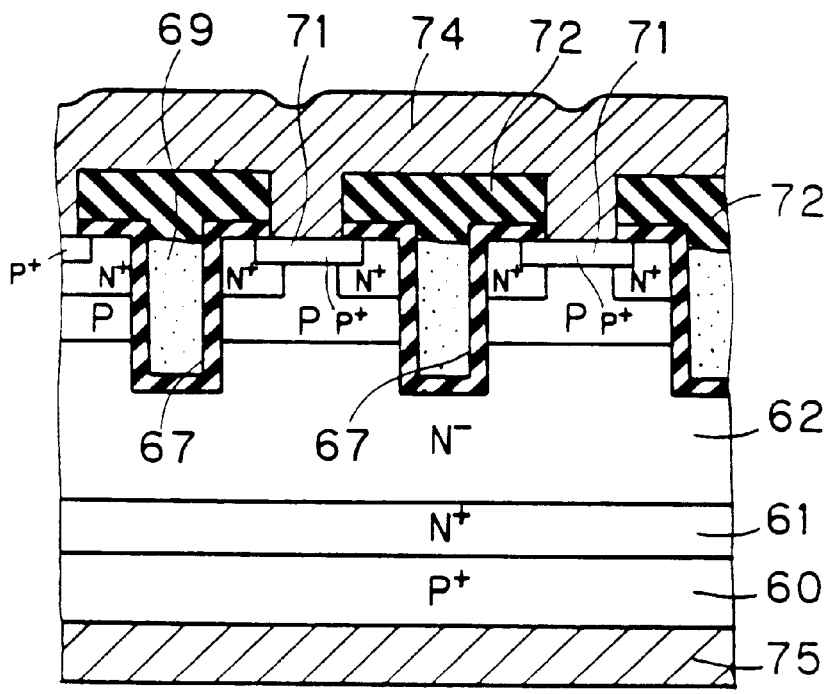
Figure 26:
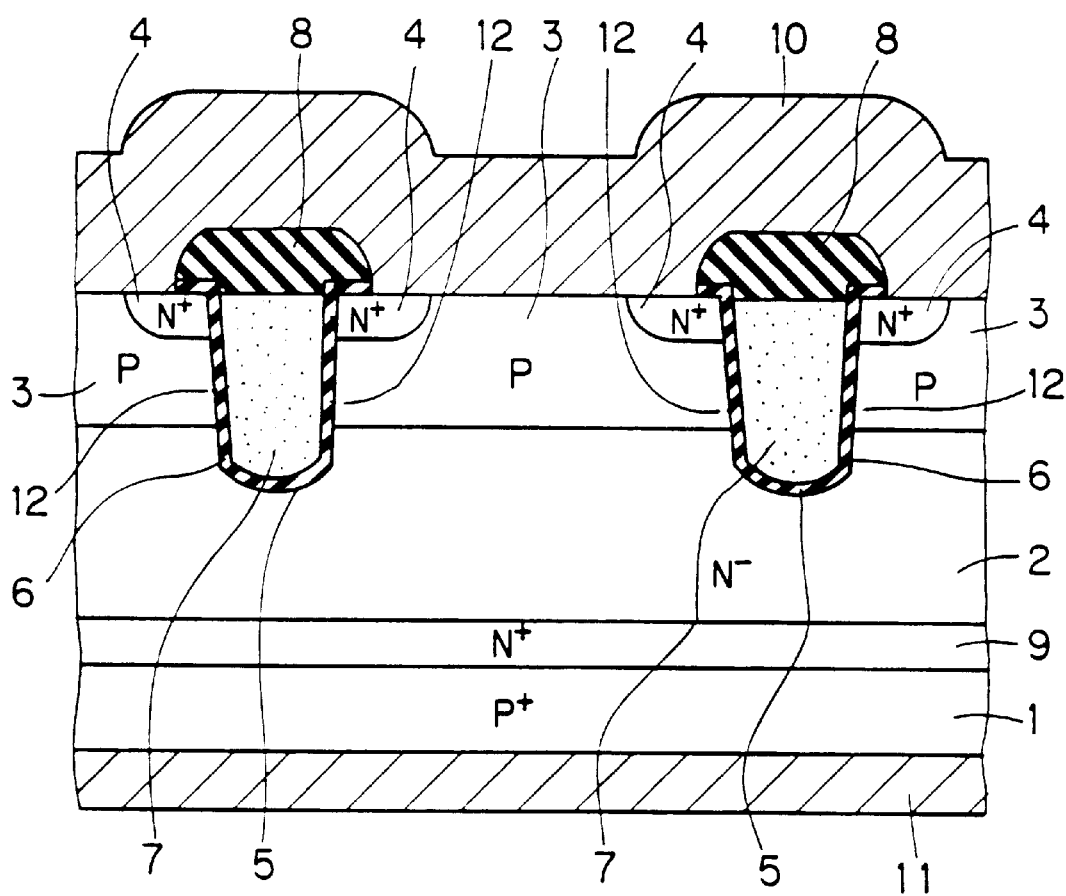
FIG. 26 is a partial sectional view of a conventional insulated gate semiconductor device.
Figure 27:
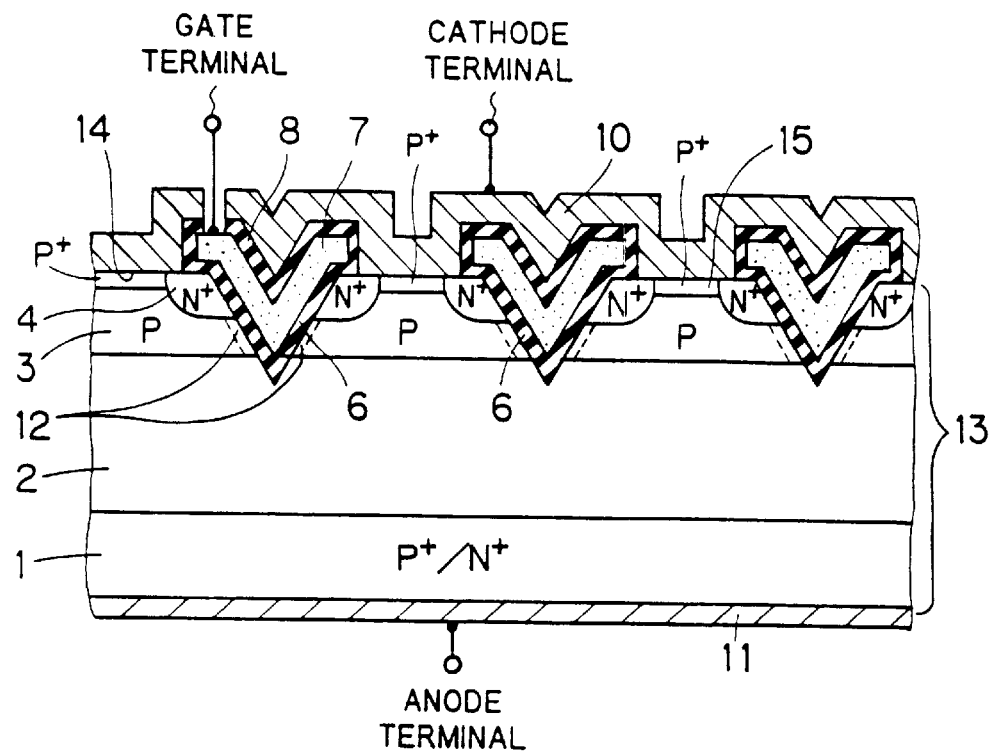
FIG. 27 is a partial sectional view of another conventional insulated gate semiconductor device.
Figure 28:
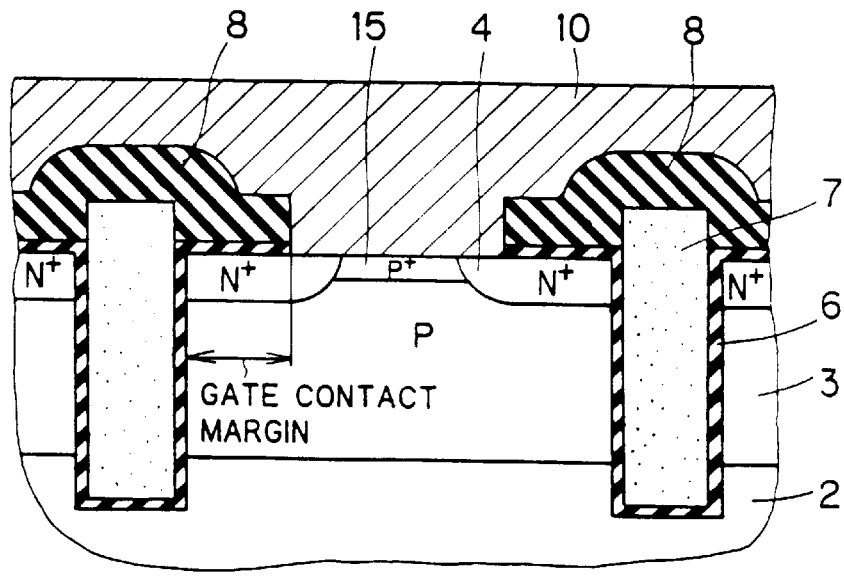
FIG. 28 is a schematic diagram showing a contact margin in the another conventional insulated gate semiconductor device.
Figure 29:
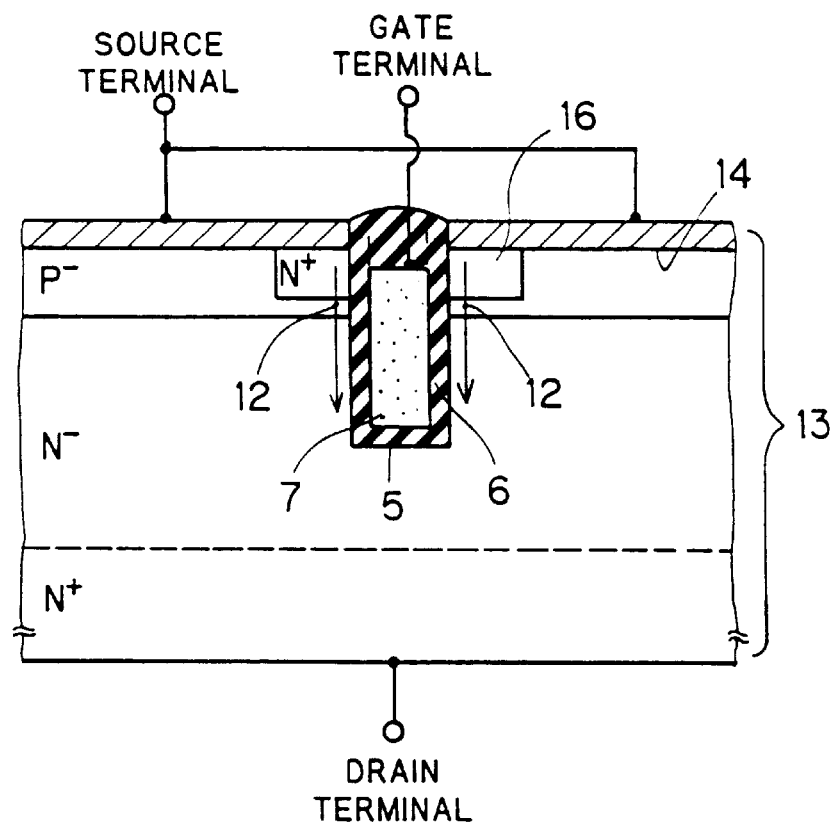
FIG. 29 is a partial sectional view of still another conventional insulated gate semiconductor device.
Figure 30:
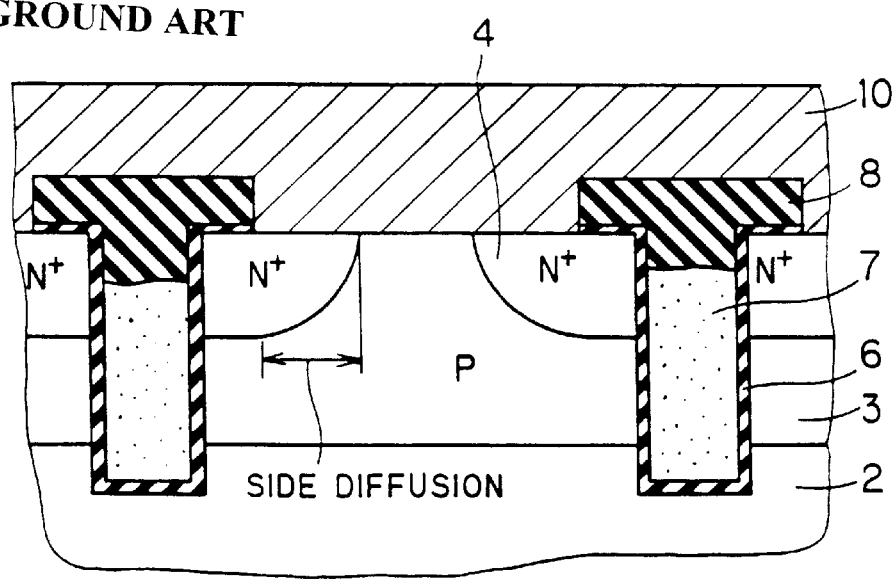
FIG. 30 is a schematic diagram showing side diffusion in the still another conventional insulated gate semiconductor device.

FIGS. 24 and 25 are partial cross sectional views of a cell during manufacturing steps in the present embodiment. As compared with the manufacturing processes according to the first preferred embodiment, the manufacturing processes according to the present embodiment use a different resist pattern to form the N⁺ emitter regions 65, and also uses a different resist pattern to form the interlayer insulation film which is shown in FIG. 13. The other manufacturing steps are similar. More precisely, the resist is stacked on the surface of the P base layer 63, the plurality of the openings which are in the shape of parallel strips and the openings which are linked to these openings are formed by photolithographic processes, the resist pattern in which resists are left scattered in the shape of columns is formed, and using this resist pattern 64 as a mask, N-type impurities are implanted into the surface of the P base layer 63 at a high doping concentration and diffused by annealing to thereby define the N⁺ emitter regions 65.

Further, after forming the P⁺ semiconductor layers 71 along the inner walls 67 so that the P⁺ semiconductor layers 71 and the link portions of the N⁺ emitter regions 65 appear alternately, the BPSG 72 is stacked on the surface of the polysilicon 69 filling up the grooves formed by the inner walls 67 and on the surface of the thermal oxidation film 68, and the resist 73 is stacked on a surface of the BPSG 72. By photolithographic processes, openings surrounding the P⁺ semiconductor layers 71 and the link portions of the N⁺ emitter regions 65 are formed in the resist 73, at areas except for portions of the N⁺ emitter regions 65 which extend along the inner walls 67 and except for portions of the P⁺ semiconductor layers 71 which are in the vicinity of the N⁺ emitter regions 65, to thereby obtain a resist pattern. Using the resist pattern as a mask, the BPSG 72 and the thermal oxidation film 68 are etched, whereby the interlayer insulation film 72 is formed on the surface of the polysilicon 69 which is buried in the grooves which are defined by the inner walls 67 (See FIG. 24). The resist pattern is then removed.

Following this, to short-circuit the P⁺ semiconductor layer 71 and the N⁺ emitter regions 65 which are exposed by etching, Al-Si is stacked which serves as a conductive layer, on a surface of the element in which the P⁺ semiconductor layer 71, the N⁺ emitter regions 65 and the interlayer insulation film 72 are disposed. This creates a gate line and a gate pad at the same time which are connected to the polysilicon 69 which is buried in the grooves which are formed by the emitter electrode 73 and the inner walls 67 (See FIG. 25).

Further, AlMoNiAu alloy which serves as a conductive layer is stacked on the surface of the P⁺ silicon substrate 60, thereby forming a collector electrode 75.

Through such manufacturing processes, the U-type IGBT according to the present embodiment is manufactured at an inexpensive cost.

In addition, although the description above has described that the P⁺ semiconductor layer 71 is formed in the present embodiment in a similar manner to that in the first preferred embodiment, the present embodiment does not always require to diffuse the P⁺ semiconductor layers 45 shallower than the thickness of the N⁺ emitter layers 44, considering side diffusion, as described earlier. Hence, during the manufacturing processes in the present embodiment, P-type impurities may be implanted through the thermal oxidation film 68 at a higher impurity concentration than that of the N⁺ emitter regions 65 and then thermally diffused deeper than the bottom of the N⁺ emitter regions 65 to obtain the P⁺ semiconductor layer 71 whose bottom surface contacts the P base layers 63.

Although the foregoing has described the present invention in relation to a U-type IGBT of an N⁻channel type, the present invention is applicable to a U-type IGBT of a P-channel type.

While the invention has been described in detail, the foregoing description is in all aspects illustrative and not restrictive. It is understood that numerous other modifications and variations can be devised without departing from the scope of the invention.

I claim:

1. A method of manufacturing an insulated gate semiconductor device, comprising:

a first step of preparing a semiconductor substrate which comprises a first semiconductor layer of a first conductivity type being exposed on a first major surface of said semiconductor substrate;

a second step of implanting impurities of a second conductivity type into said first major surface of said semiconductor substrate to thereby form a second semiconductor layer of the second conductivity type;

a third step of selectively implanting impurities of the first conductivity type, and diffusing said impurities of the first conductivity type in a surface of said second semiconductor layer to thereby selectively form a third semiconductor layer of the first conductivity type having a higher impurity concentration than said first semiconductor layer;

a fourth step of forming a shielding film on said first major surface, forming an opening in said shielding film on a portion of a surface of said third semiconductor layer so that said opening extends along a surface of said shielding film, selectively removing a semiconductor down to said first semiconductor layer while using as a mask said shielding film which includes said opening to thereby form a groove-shaped inner wall which defines a groove, and thereafter removing said shielding film;

a fifth step of forming an insulation film on a surface of said groove-shaped inner wall and on said first major surface;

a sixth step of stacking a conductive material on said insulation film so that said groove is filled up;

a seventh step of removing said conductive material, while leaving said insulation film, until a surface of a portion of said insulation film formed on said first major surface is exposed;

an eighth step of selectively implanting impurities of the second conductivity type at a higher impurity concentration than that of said third semiconductor layer into a portion of said first major surface on which said second semiconductor layer is selectively exposed, and diffusing said impurities of the second conductivity type to thereby selectively form a fourth semiconductor layer of the second conductivity type connecting said second semiconductor layer;

a ninth step of stacking an insulation material on said portion of said insulation film, which is exposed at said seventh step, and on a surface of said conductive material;

a tenth step of stacking a resist on a surface of said insulation material, forming an opening therein which surrounds said fourth semiconductor layer, and a portion of said third semiconductor layer which is adjacent to said fourth semiconductor layer, selectively removing said insulation material and said insulation film while using said resist as a mask which includes said opening to thereby expose said fourth and said third semiconductor layers;

an eleventh step of stacking a conductive layer on said third and fourth semiconductor layers, which are exposed after said tenth step and on said surface of said insulation material; and a twelfth step of stacking a conductive layer on a second major surface of said semiconductor substrate which is on an opposite side to said first major surface.

2. A method of manufacturing an insulated gate semiconductor device, comprising:

a first step of preparing a semiconductor substrate which comprises a first semiconductor layer of a first conductivity type being exposed on a first major surface of said semiconductor substrate:

a second step of implanting impurities of a second conductivity type into said first major surface of said semiconductor substrate to thereby form a second semiconductor layer of the second conductivity type;

a third step of selectively implanting impurities of the first conductivity type, and diffusing said impurities of the first conductivity type in a surface of said second semiconductor layer to thereby selectively form third semiconductor layers of the first conductivity type in a shape of columns arranged parallel to each other having a higher impurity concentration than said first semiconductor layer;

a fourth step of forming a shielding film on said first major surface, forming an opening in said shielding film on a portion of a surface of said third semiconductor layers so that said opening extends along a surface of columns of said third semiconductor layers, selectively removing a semiconductor down to said first semiconductor layer while using said shielding film as a mask which includes said opening to thereby form groove-shaped inner walls which define grooves, and thereafter removing said shielding film;

a fifth step of forming an insulation film on surfaces of said groove-shaped inner walls and on said first major surface;

a sixth step of stacking a conductive material on said insulation film so that said grooves are filled up;

a seventh step of removing said conductive material, while leaving said insulation film until a surface of a portion of said insulation film which is formed on said first major surface is exposed;

an eighth step of selectively implanting impurities of the second conductivity type at a higher impurity concentration than that of said third semiconductor layers into a portion of said first major surface on which said second semiconductor layer is selectively exposed, and diffusing said impurities of the second conductivity type to thereby selectively form a fourth semiconductor layer of the second conductivity type connecting said second semiconductor layer;

a ninth step of stacking an insulation material on said portion of said insulation film, which is exposed after said seventh step, and on a surface of said conductive material;

a tenth step of stacking a resist on a surface of said insulation material, forming an opening therein which surrounds said fourth semiconductor layer and portions of said third semiconductor layers which are adjacent to said fourth semiconductor layer, selectively removing said insulation material and said insulation film while using said resist as a mask which includes said opening to thereby expose said fourth and said third semiconductor layers;

an eleventh step of stacking a conductive layer on said third and fourth semiconductor layers which are exposed after said tenth step and on said surface of said insulation material; and a twelfth step of stacking a conductive layer on a second major surface of said semiconductor substrate which is on an opposite side to said first major surface.

3. A method of manufacturing an insulated gate semiconductor device, comprising:

a first step of preparing a semiconductor substrate which comprises a first semiconductor layer of a first conductivity type being exposed on a first major surface of said semiconductor substrate;

a second step of implanting impurities of a second conductivity type into said first major surface of said semiconductor substrate to thereby form a second semiconductor layer of the second conductivity type;

a third step of selectively implanting impurities of the first conductivity type, and diffusing said impurities of the first conductivity type in a surface of said second semiconductor layer to thereby selectively form third semiconductor layers of the first conductivity type having a higher impurity concentration than said first semiconductor layer;

a fourth step of forming a shielding film on said first major surface, forming an opening in said shielding film on a portion of a surface of said third semiconductor layers so that said opening extends along a surface of columns of said third semiconductor layers, selectively removing a semiconductor down to said first semiconductor layer while using said shielding film as a mask which includes said opening to thereby form groove-shaped inner walls which define grooves, and thereafter removing said shielding film;

a fifth step of forming an insulation film on surfaces of said groove-shaped inner walls and on said first major surface;

a sixth step of stacking a conductive material on said insulation film so that said grooves are filled up;

a seventh step of removing said conductive material, while leaving said insulation film until a surface of a portion of said insulation film which is formed on said first major surface is exposed;

an eighth step of selectively implanting impurities of the second conductivity type at a higher impurity concentration than that of said third semiconductor layers into a portion of said first major surface on which said second semiconductor layer is selectively exposed, and diffusing said impurities of the second conductivity type to thereby selectively form a fourth semiconductor layer of the second conductivity type connecting said second semiconductor layer;

a ninth step of stacking an insulation material on said portion of said insulation film, which is exposed after said seventh step, and on a surface of said conductive material;

a tenth step of stacking a resist on a surface of said insulation material, forming an opening therein which surrounds said fourth semiconductor layer and portions of said third semiconductor layers which are adjacent to said fourth semiconductor layer, selectively removing said insulation material and said insulation film while using said resist as a mask which includes said opening to thereby expose said fourth and said third semiconductor layers;

an eleventh step of stacking a conductive layer on said third and fourth semiconductor layers which are exposed after said tenth step and on said surface of said insulation material: and a twelfth step of stacking a conductive layer on a second major surface of said semiconductor substrate which is on an opposite side to said first major surface, wherein at said third step, said third semiconductor layers are formed in a shape including columns and a link portion linking adjacent two of said columns and at said tenth step, said opening of said resist is formed to surround said fourth and said third semiconductor layers except for portions of said surfaces of said third semiconductor layers which are adjacent to and along said inner walls.

4. A method of manufacturing an insulated gate semiconductor device, comprising:

a first step of preparing a semiconductor substrate which comprises a first semiconductor layer of a first conductivity type being exposed on a first major surface of said semiconductor substrate:

a second step of implanting impurities of a second conductivity type into [a] said first major surface of said semiconductor substrate to thereby form a second semiconductor layer of the second conductivity type;

a third step of selectively implanting impurities of the first conductivity type, and diffusing said impurities of the first conductivity type in a surface of said second semiconductor layer to thereby form third semiconductor layers of the first conductivity type in a shape of columns arranged parallel to each other and a link portion linking adjacent two of said columns having a higher impurity concentration than said first semiconductor layer;

a fourth step of forming a shielding film on said first major surface, forming an opening in said shielding film on a portion of a surface of said third semiconductor layers so that said opening extends along a surface of columns of said third semiconductor layers, selectively removing a semiconductor down to said first semiconductor layer while using said shielding film as a mask which includes said opening to thereby form groove-shaped inner walls which define grooves, and thereafter removing said shielding film;

a fifth step of forming an insulation film on surfaces of said groove-shaped inner walls and on said first major surface;

a sixth step of stacking a conductive material on said insulation film so that said grooves are filled up;

a seventh step of removing said conductive material while leaving said insulation film until a surface of a portion of said insulation film which is formed on said first major surface is exposed;

an eighth step of selectively implanting impurities of the second conductivity type at a higher impurity concentration than that of said third semiconductor layers into a portion of said first major surface on which said second semiconductor layer is selectively exposed, and diffusing said impurities of the second conductivity type to thereby selectively form a fourth semiconductor layer of the second conductivity type connecting said second semiconductor layer;

a ninth step of stacking an insulation material on said portion of said insulation film, which is exposed after said seventh step, and on a surface of said conductive material;

a tenth step of stacking a resist on a surface of said insulation material, forming an opening therein which surrounds said fourth semiconductor layer and said third semiconductor layers, except for said portions of said surfaces of said third semiconductor layers which are adjacent to and along said inner walls and except for a portion of a surface of said fourth semiconductor layer, selectively removing said insulation material and said insulation film while using said resist as a mask which includes said opening to thereby expose said fourth semiconductor layer and said third semiconductor layers;

an eleventh step of stacking a conductive layer on said third and fourth semiconductor layers which are exposed after said tenth step and on said surface of said insulation material; and a twelfth step of stacking a conductive layer on a second major surface of said semiconductor substrate which is on an opposite side to said first major surface.

5. A method of manufacturing an insulated gate semiconductor device, comprising:

a first step of preparing a semiconductor substrate which comprises a first semiconductor layer of a first conductivity type being exposed on a first major surface of said semiconductor substrate:

a second step of implanting impurities of a second conductivity type into said first major surface of said semiconductor substrate to thereby form a second semiconductor layer of the second conductivity type;

a third step of selectively implanting impurities of the first conductivity type, and diffusing said impurities of the first conductivity type in a surface of said second semiconductor layer to thereby selectively form third semiconductor layers of the first conductivity type in a shape of columns arranged parallel to each other and a link portion linking adjacent two of said columns having a higher impurity concentration than said first semiconductor layer;

a fourth step of forming a shielding film on said first major surface, forming an opening in said shielding film on a portion of a surface of said third semiconductor layers so that said opening extends along a surface of columns of said third semiconductor layers, selectively removing a semiconductor down to said first semiconductor layer while using said shielding film as a mask which includes said opening to thereby form groove-shaped inner walls which define grooves, and thereafter removing said shielding film;

a fifth step of forming an insulation film on surfaces of said groove-shaped inner walls and on said first major surface;

a sixth step of stacking a conductive material on said insulation film so that said grooves are filled up;

a seventh step of removing said conductive material while leaving said insulation film until a surface of a portion of said insulation film which is formed on said first major surface is exposed;

an eighth step of stacking an insulation material on a portion of said insulation film which is exposed after said seventh step, and said surface of said conductive material;

a ninth step of stacking a resist on a surface of said insulation material, forming an opening therein which surrounds said second semiconductor and third semiconductor layers, except for portions of surfaces of said third semiconductor layers which are adjacent to and along said inner walls and except for a portion of said exposed surface of said second semiconductor layer which is adjacent to said portions of said surfaces of said third semiconductor layers, selectively removing said insulation material and said insulation film while using a resist pattern which includes said opening to thereby expose said second semiconductor layer and said portions of said third semiconductor layers which are adjacent to said second semiconductor layer;

a tenth step of stacking a conductive layer on said second and third semiconductor layer which is exposed after said ninth step and on said surface of said insulation material; and an eleventh step of stacking a conductive layer on a second major surface of said semiconductor substrate which is on an opposite side to said first major surface.

6. A method of manufacturing an insulated gate semiconductor device, comprising:

a first step of forming a semiconductor substrate which comprises a first semiconductor layer of a first conductivity type and a second semiconductor layer of a second conductivity type disposed on a surface of said first semiconductor layer;

a second step of implanting impurities of the first conductivity type into a first major surface of said semiconductor substrate which is on the second semiconductor layer side of said semiconductor substrate to thereby form a third semiconductor layer of the first conductivity type;

a third step of stacking a resist on said first major surface, selectively removing said resist to obtain a resist pattern, selectively implanting impurities of the second conductivity type using said resist pattern as a mask, and diffusing said impurities of the second conductivity type in a surface of said third semiconductor layer to thereby selectively form a fourth semiconductor layer of the second conductivity type having a higher impurity concentration than said second semiconductor layer;

a fourth step of forming a shielding film on said first major surface, forming an opening in said shielding film on a portion of a surface of said fourth semiconductor layer so that said opening extends along a surface of said shielding film, selectively removing a semiconductor down to said second semiconductor layer while using as a mask said shielding film which includes said opening to thereby form a groove-shaped inner wall which defines a groove, and thereafter removing said shielding film;

a fifth step of forming an insulation film on a surface of said groove-shaped inner wall and on said first major surface;

a sixth step of stacking a conductive material on said insulation film so that said groove is filled up;

a seventh step of removing said conductive material, while leaving said insulation film, until a surface of a portion of said insulation film formed on said first major surface is exposed;

an eighth step of stacking a resist on a portion of said insulation film, which is exposed on said first major surface after said seventh step, and said surface of said conductive material, forming an opening therein at such a position as to surround an area which corresponds to said resist which is selectively left at said third step and to surround a portion of said surface of said fourth semiconductor layer which is adjacent to said area, selectively implanting impurities of the first conductivity type at a higher impurity concentration than that of said fourth semiconductor layer through said insulation film while using said resist as a mask which includes said opening, and diffusing said impurities of the first conductivity type to thereby selectively form a fifth semiconductor layer of the first conductivity type connecting said third semiconductor layer;

a ninth step of stacking an insulation material on said portion of said insulation film, which is exposed at said seventh step, and on a surface of said conductive material;

a tenth step of stacking a resist on a surface of said insulation material, forming an opening therein which surrounds said fifth semiconductor layer, and a portion of said fourth semiconductor layer which is adjacent to said fifth semiconductor layer, selectively removing said insulation material and said insulation film while using said resist as a mask which includes said opening to thereby expose said fifth and said fourth semiconductor layers;

an eleventh step of stacking a conductive layer on said fourth and fifth semiconductor layers, which are exposed after said tenth step and on said surface of said insulation material; and a twelfth step of stacking a conductive layer on a second major surface of said semiconductor substrate which is on an opposite side to said first major surface.

7. A method of manufacturing an insulated gate semiconductor device, comprising:

a first step of forming a semiconductor substrate which comprises a first semiconductor layer of a first conductivity type and a second semiconductor layer of a second conductivity type disposed on a surface of said first semiconductor layer;

a second step of implanting impurities of the first conductivity type into a first major surface of said semiconductor substrate which is on the second semiconductor layer side of said semiconductor substrate to thereby form a third semiconductor layer of the first conductivity type;

a third step of stacking a resist on said first major surface, selectively removing said resist to leave a portion of said resist as a plurality of regions which are arranged parallel to each other in the shape of columns so that a resist pattern is formed, selectively implanting impurities of the second conductivity type while using said resist pattern as a mask, and diffusing said impurities of the second conductivity type in a surface of said third semiconductor layer to thereby selectively form fourth semiconductor layers of the second conductivity type having a higher impurity concentration than said second semiconductor layer;

a fourth step of forming a shielding film on said first major surface, forming an opening in said shielding film on a portion of a surface of said fourth semiconductor layers so that said opening extends along a surface of columns of said fourth semiconductor layers, selectively removing a semiconductor down to said second semiconductor layer while using said shielding film as a mask which includes said opening to thereby form groove-shaped inner walls which define grooves, and thereafter removing said shielding film;

a fifth step of forming an insulation film on surfaces of said groove-shaped inner walls and on said first major surface;

a sixth step of stacking a conductive material on said insulation film so that said grooves are filled up;

a seventh step of removing said conductive material, while leaving said insulation film, until a surface of a portion of said insulation film which is formed on said first major surface is exposed;

an eighth step of stacking a resist on a portion of said insulation film, which is exposed on said first major surface after said seventh step, and said surface of said conductive material, forming an opening therein at such a position as to surround an area which corresponds to said resist which is left in the shape of columns at said third step and to surround portions of surfaces of said fourth semiconductor layers which are adjacent to said area, selectively implanting impurities of the first conductivity type at a higher impurity concentration than that of said fourth semiconductor layers through said insulation film while using said resist as a mask which includes said opening, and diffusing said impurities of the first conductivity type to thereby selectively form a fifth semiconductor layer of the first conductivity type connecting said third semiconductor layer;

a ninth step of stacking an insulation material on said portion of said insulation film, which is exposed after said seventh step, and on a surface of said conductive material;

a tenth step of stacking a resist on a surface of said insulation material, forming an opening therein which surrounds said fifth semiconductor layer and portions of said fourth semiconductor layers which are adjacent to said fifth semiconductor layer, selectively removing said insulation material and said insulation film while using said resist as a mask which includes said opening to thereby expose said fifth and said fourth semiconductor layers;

an eleventh step of stacking a conductive layer on said fourth and fifth semiconductor layers which are exposed after said tenth step and on said surface of said insulation material; and a twelfth step of stacking a conductive layer on a second major surface of said semiconductor substrate which is on an opposite side to said first major surface.

8. The method of claim 7, wherein at said third step, said portion of said resist is left as a plurality of regions which are scattered in the shape of columns and are arranged parallel to each other to thereby obtain said resist pattern, and at said tenth step, said opening of said resist is formed to surround said fifth and said fourth semiconductor layers except for portions of said surfaces of said fourth semiconductor layers which are adjacent to and along said inner walls.

9. A method of manufacturing an insulated gate semiconductor device, comprising:

a first step of forming a semiconductor substrate which comprises a first semiconductor layer of a first conductivity type and a second semiconductor layer of a second conductivity type disposed on a surface of said first semiconductor layer;

a second step of implanting impurities of the first conductivity type into a first major surface of said semiconductor substrate which is on the second semiconductor layer side of said semiconductor substrate to thereby form a third semiconductor layer of the first conductivity type;

a third step of stacking a resist on said first major surface, selectively removing said resist to leave a portion of said resist as a plurality of regions which are scattered in the shape of columns and arranged parallel to each other so that a resist pattern is formed, selectively implanting impurities of the second conductivity type using said resist pattern as a mask, and diffusing said impurities of the second conductivity type in a surface of said third semiconductor layer to thereby form fourth semiconductor layers of the second conductivity type having a higher impurity concentration than said second semiconductor layer;

a fourth step of forming a shielding film on said first major surface, forming an opening in said shielding film on a portion of a surface of said fourth semiconductor layers so that said opening extends along a surface of columns of said fourth semiconductor layers, selectively removing a semiconductor down to said second semiconductor layer while using said shielding film as a mask which includes said opening to thereby form groove-shaped inner walls which define grooves, and thereafter removing said shielding film;

a fifth step of forming an insulation film on surfaces of said groove-shaped inner walls and on said first major surface;

a sixth step of stacking a conductive material on said insulation film so that said grooves are filled up;

a seventh step of removing said conductive material, while leaving said insulation film, until a surface of a portion of said insulation film which is formed on said first major surface is exposed;

an eighth step of stacking a resist on a portion of said insulation film, which is exposed on said first major surface after said seventh step, and said surface of said conductive material, forming an opening therein at such a position as to surround an area which corresponds to said resist which is left in the shape of columns at said third step and to surround portions of surfaces of said fourth semiconductor layers which are adjacent to said area, selectively implanting impurities of the first conductivity type at a higher impurity concentration than that of said fourth semiconductor layers through said insulation film while using said resist as a mask which includes said opening, and diffusing said impurities of the first conductivity type to thereby selectively form a fifth semiconductor layer of the first conductivity type connecting said third semiconductor layer;

a ninth step of stacking an insulation material on said portion of said insulation film, which is exposed after said seventh step, and on a surface of said conductive material;

a tenth step of stacking a resist on a surface of said insulation material, forming an opening therein which surrounds said fifth semiconductor layer and said fourth semiconductor layers, except for said portions of said surfaces of said fourth semiconductor layers which are adjacent to and along said inner walls and except for a portion of a surface of said fifth semiconductor layer, selectively removing said insulation material and said insulation film while using said resist as a mask which includes said opening to thereby expose said fifth semiconductor layer and said fourth semiconductor layers;

an eleventh step of stacking a conductive layer on said fourth and fifth semiconductor layers which are exposed after said tenth step and on said surface of said insulation material; and a twelfth step of stacking a conductive layer on a second major surface of said semiconductor substrate which is on an opposite side to said first major surface.

10. A method of manufacturing an insulated gate semiconductor device, comprising:

a first step of forming a semiconductor substrate which comprises a first semiconductor layer of a first conductivity type and a second semiconductor layer of a second conductivity type disposed on a surface of said first semiconductor layer;

a second step of implanting impurities of the first conductivity type into a first major surface of said semiconductor substrate which is on the second semiconductor layer side of said semiconductor substrate to thereby form a third semiconductor layer of the first conductivity type;

a third step of stacking a resist on said first major surface, selectively removing said resist to leave a portion of said resist as a plurality of regions which are scattered in the shape of columns and arranged parallel to each other so that a resist pattern is formed, selectively implanting impurities of the second conductivity type using said resist pattern as a mask, and diffusing said impurities of the second conductivity type in a surface of said third semiconductor layer so as to leave a portion of an exposed surface of said third semiconductor layer which is covered with said resist to thereby selectively form fourth semiconductor layers of the second conductivity type having a higher impurity concentration than said second semiconductor layer;

a fourth step of forming a shielding film on said first major surface forming an opening in said shielding film on a portion of a surface of said fourth semiconductor layers so that said opening extends along a surface of columns of said fourth semiconductor layers, selectively removing a semiconductor down to said second semiconductor layer while using said shielding film as a mask which includes said opening to thereby form groove-shaped inner walls which define grooves, and thereafter removing said shielding film;

a fifth step of forming an insulation film on surfaces of said groove-shaped inner walls and on said first major surface;

a sixth step of stacking a conductive material on said insulation film so that said grooves are filled up;

a seventh step of removing said conductive material, while leaving said insulation film, until a surface of a portion of said insulation film which is formed on said first major surface is exposed;

an eighth step of stacking an insulation material on a portion of said insulation film which is exposed after said seventh step, and said surface of said conductive material;

a ninth step of stacking a resist on a surface of said insulation material, forming an opening therein which surrounds said third semiconductor and fourth semiconductor layers, except for portions of surfaces of said fourth semiconductor layers which are adjacent to and along said inner walls and except for a portion of said exposed surface of said third semiconductor layer which is adjacent to said portions of said surfaces of said fourth semiconductor layers, selectively removing said insulation material and said insulation film while using a resist pattern which includes said opening to thereby expose said third semiconductor layer and said portions of said fourth semiconductor layers which are adjacent to said third semiconductor layer;

a tenth step of stacking a conductive layer on said third and fourth semiconductor layer which is exposed after said ninth step and on said surface of said insulation material; and an eleventh step of stacking a conductive layer on said second major surface of said semiconductor substrate which is on an opposite side to said first major surface.

11. A method of manufacturing an insulated gate semiconductor device, comprising:

a first step of forming a semiconductor substrate which comprises a first semiconductor layer of a first conductivity type and a second semiconductor layer of a second conductivity type disposed on a surface of said first semiconductor layer;

a second step of implanting impurities of the first conductivity type into a first major surface of said semiconductor substrate which is on the second semiconductor layer side of said semiconductor substrate to thereby form a third semiconductor layer of the first conductivity type;

a third step of selectively implanting impurities of the second conductivity type, and diffusing said impurities of the second conductivity type in a surface of said third semiconductor layer to thereby selectively form a fourth semiconductor layer of the second conductivity type having a higher impurity concentration than said second semiconductor layer;

a fourth step of forming a shielding film on said first major surface, forming an opening in said shielding film on a portion of a surface of said fourth semiconductor layer so that said opening extends along a surface of said shielding film, selectively removing a semiconductor down to said second semiconductor layer while using as a mask said shielding film which includes said opening to thereby form a groove-shaped inner wall which defines a groove, and thereafter removing said shielding film;

a fifth step of forming an insulation film on a surface of said groove-shaped inner wall and on said first major surface;

a sixth step of stacking a conductive material on said insulation film so that said groove is filled up;

a seventh step of removing said conductive material, while leaving said insulation film, until a surface of a portion of said insulation film formed on said first major surface is exposed;

an eighth step of selectively implanting impurities of the first conductivity type at a higher impurity concentration than that of said fourth semiconductor layer into a portion of said first major surface on which said third semiconductor layer is selectively exposed, and diffusing said impurities of the first conductivity type to thereby selectively form a fifth semiconductor layer of the first conductivity type connecting said third semiconductor layer;

a ninth step of stacking an insulation material on said portion of said insulation film, which is exposed at said seventh step, and on a surface of said conductive material;

a tenth step of stacking a resist on a surface of said insulation material, forming an opening therein which surrounds said fifth semiconductor layer, and a portion of said fourth semiconductor layer which is adjacent to said fifth semiconductor layer, selectively removing said insulation material and said insulation film while using said resist as a mask which includes said opening to thereby expose said fifth and said fourth semiconductor layers;

an eleventh step of stacking a conductive layer on said fourth and fifth semiconductor layers, which are exposed after said tenth step and on said surface of said insulation material; and a twelfth step of stacking a conductive layer on a second major surface of said semiconductor substrate which is on an opposite side to said first major surface.

12. A method of manufacturing an insulated gate semiconductor device, comprising:

a first step of forming a semiconductor substrate which comprises a first semiconductor layer of a first conductivity type and a second semiconductor layer of a second conductivity type disposed on a surface of said first semiconductor layer;

a second step of implanting impurities of the first conductivity type into a first major surface of said semiconductor substrate which is on the second semiconductor layer side of said semiconductor substrate to thereby form a third semiconductor layer of the first conductivity type;

a third step of selectively implanting impurities of the second conductivity type, and diffusing said impurities of the second conductivity in a surface of said third semiconductor layer to thereby selectively form fourth semiconductor layers of the second conductivity type in a shape of columns parallel to each other having a higher impurity concentration than said second semiconductor layer;

a fourth step of forming a shielding film on said first major surface, forming an opening in said shielding film on a portion of a surface of said fourth semiconductor layers so that said opening extends along a surface of columns of said fourth semiconductor layers, selectively removing a semiconductor down to said second semiconductor layer while using said shielding film as a mask which includes said opening to thereby form groove-shaped inner walls which define grooves, and thereafter removing said shielding film;

a fifth step of forming an insulation film on surfaces of said groove-shaped inner walls and on said first major surface;

a sixth step of stacking a conductive material on said insulation film so that said grooves are filled up;

a seventh step of removing said conductive material, while leaving said insulation film, until a surface of a portion of said insulation film which is formed on said first major surface is exposed;

an eighth step of selectively implanting impurities of the first conductivity type at a higher impurity concentration than that of said fourth semiconductor layers into a portion of said first major surface on which said third semiconductor layer is selectively exposed, and diffusing said impurities of the first conductivity type to thereby selectively form a fifth semiconductor layer of the first conductivity type connecting said third semiconductor layer;

a ninth step of stacking an insulation material on said portion of said insulation film, which is exposed after said seventh step, and on a surface of said conductive material;

a tenth step of stacking a resist on a surface of said insulation material, forming an opening therein which surrounds said fifth semiconductor layer and portions of said fourth semiconductor layers which are adjacent to said fifth semiconductor layer, selectively removing said insulation material and said insulation film while using said resist as a mask which includes said opening to thereby expose said fifth and said fourth semiconductor layers;

an eleventh step of stacking a conductive layer on said fourth and fifth semiconductor layers which are exposed after said tenth step and on said surface of said insulation material; and a twelfth step of stacking a conductive layer on a second major surface of said semiconductor substrate which is on an opposite side to said first major surface.

13. A method of manufacturing an insulated gate semiconductor device, comprising:

a first step of forming a semiconductor substrate which comprises a first semiconductor layer of a first conductivity type and a second semiconductor layer of a second conductivity type disposed on a surface of said first semiconductor layer;

a second step of implanting impurities of the first conductivity type into a first major surface of said semiconductor substrate which is on the second semiconductor layer side of said semiconductor substrate to thereby form a third semiconductor layer of the first conductivity type;

a third step of selectively implanting impurities of the second conductivity type, and diffusing said impurities of the second conductivity type in a surface of said third semiconductor layer to thereby form fourth semiconductor layers of the second conductivity type having a higher impurity concentration than said second semiconductor layer;

a fourth step of forming a shielding film on said first major surface, forming an opening in said shielding film on a portion of a surface of said fourth semiconductor layers so that said opening extends along a surface of columns of said fourth semiconductor layers, selectively removing a semiconductor down to said second semiconductor layer while using said shielding film as a mask which includes said opening to thereby form groove-shaped inner walls which define grooves, and thereafter removing said shielding film;

a fifth step of forming an insulation film on surfaces of said groove-shaped inner walls and on said first major surface;

a sixth step of stacking a conductive material on said insulation film so that said grooves are filled up;

a seventh step of removing said conductive material, while leaving said insulation film, until a surface of a portion of said insulation film which is formed on said first major surface is exposed;

an eighth step of selectively implanting impurities of the first conductivity type at a higher impurity concentration than that of said fourth semiconductor layers into a portion of said first major surface on which said third semiconductor layer is selectively exposed, and diffusing said impurities of the first conductivity type to thereby selectively form a fifth semiconductor layer of the first conductivity type connecting said third semiconductor layer;

a ninth step of stacking an insulation material on said portion of said insulation film, which is exposed after said seventh step, and on a surface of said conductive material;

a tenth step of stacking a resist on a surface of said insulation material, forming an opening therein which surrounds said fifth semiconductor layer and said fourth semiconductor layers, except for said portions of said surfaces of said fourth semiconductor layers which are adjacent to and along said inner walls and except for a portion of a surface of said fifth semiconductor layer, selectively removing said insulation material and said insulation film while using said resist as a mask which includes said opening to thereby expose said fifth semiconductor layer and said fourth semiconductor layers;

an eleventh step of stacking a conductive layer on said fourth and fifth semiconductor layers which are exposed after said tenth step and on said surface of said insulation material; and a twelfth step of stacking a conductive layer on a second major surface of said semiconductor substrate which is on an opposite side to said first major surface, said fourth semiconductor layers being formed in a shape including columns and a link portion linking adjacent two of said columns, wherein at said third step and at said tenth step, said opening of said resist is formed to surround said fifth and said fourth semiconductor layers except for portions of said surfaces of said fourth semiconductor layers which are adjacent to and along said inner walls.

14. A method of manufacturing an insulated gate semiconductor device, comprising:

a first step of forming a semiconductor substrate which comprises a first semiconductor layer of a first conductivity type and a second semiconductor layer of a second conductivity type disposed on a surface of said first semiconductor layer;

a second step of implanting impurities of the first conductivity type into a first major surface of said semiconductor substrate which is on the second semiconductor layer side of said semiconductor substrate to thereby form a third semiconductor layer of the first conductivity type;

a third step of selectively implanting impurities of the second conductivity type, and diffusing said impurities of the second conductivity type in a surface of said third semiconductor layer to thereby form fourth semiconductor layers of the second conductivity type in a shape of columns arranged parallel to each other and a link portion linking adjacent two of said columns having a higher impurity concentration than said second semiconductor layer;

a fourth step of forming a shielding film on said first major surface, forming an opening in said shielding film on a portion of a surface of said fourth semiconductor layers so that said opening extends along a surface of columns of said fourth semiconductor layers, selectively removing a semiconductor down to said second semiconductor layer while using said shielding film as a mask which includes said opening to thereby form groove-shaped inner walls which define grooves, and thereafter removing said shielding film;

a fifth step of forming an insulation film on surfaces of said groove-shaped inner walls and on said first major surface;

a sixth step of stacking a conductive material on said insulation film so that said grooves are filled up;

a seventh step of removing said conductive material while leaving said insulation film until a surface of a portion of said insulation film which is formed on said first major surface is exposed;

an eighth step of selectively implanting impurities of the first conductivity type at a higher impurity concentration than that of said fourth semiconductor layers into a portion of said first major surface on which said third semiconductor layer is selectively exposed, and diffusing said impurities of the first conductivity type to thereby selectively form a fifth semiconductor layer of the first conductivity type connecting said third semiconductor layer;

a ninth step of stacking an insulation material on said portion of said insulation film, which is exposed after said seventh step, and on a surface of said conductive material;

a tenth step of stacking a resist on a surface of said insulation material, forming an opening therein which surrounds said fifth semiconductor layer and said fourth semiconductor layers, except for said portions of said surfaces of said fourth semiconductor layers which are adjacent to and along said inner walls and except for a portion of a surface of said fifth semiconductor layer, selectively removing said insulation material and said insulation film while using said resist as a mask which includes said opening to thereby expose said fifth semiconductor layer and said fourth semiconductor layers;

an eleventh step of stacking a conductive layer on said fourth and fifth semiconductor layers which are exposed after said tenth step and on said surface of said insulation material; and a twelfth step of stacking a conductive layer on a second major surface of said semiconductor substrate which is on an opposite side to said first major surface.

15. A method of manufacturing an insulated gate semiconductor device, comprising:

a first step of forming a semiconductor substrate which comprises a first semiconductor layer of a first conductivity type and a second semiconductor layer of a second conductivity type disposed on a surface of said first semiconductor layer;

a second step of implanting impurities of the first conductivity type into a first major surface of said semiconductor substrate which is on the second semiconductor layer side of said semiconductor substrate to thereby form a third semiconductor layer of the first conductivity type;

a third step of selectively implanting impurities of the second conductivity type, and diffusing said impurities of the second conductivity type in a surface of said third semiconductor layer to thereby selectively form fourth semiconductor layers of the second conductivity type in a shape of columns arranged parallel to each other and a link portion linking adjacent two of said columns having a higher impurity concentration than said second semiconductor layer;

a fourth step of forming a shielding film on said first major surface, forming an opening in said shielding film on a portion of a surface of said fourth semiconductor layers so that said opening extends along a surface of columns of said fourth semiconductor layers, selectively removing a semiconductor down to said second semiconductor layer while using said shielding film as a mask which includes said opening to thereby form groove-shaped inner walls which define grooves, and thereafter removing said shielding film;

a fifth step of forming an insulation film on surfaces of said groove-shaped inner walls and on said first major surface;

a sixth step of stacking a conductive material on said insulation film so that said grooves are filled up;

a seventh step of removing said conductive material while leaving said insulation film until a surface of a portion of said insulation film which is formed on said first major surface is exposed;

an eighth step of stacking an insulation material on a portion of said insulation film which is exposed after said seventh step, and said surface of said conductive material;

a ninth step of stacking a resist on a surface of said insulation material, forming an opening therein which surrounds said third semiconductor and fourth semiconductor layers, except for portions of surfaces of said fourth semiconductor layers which are adjacent to and along said inner walls and except for a portion of said exposed surface of said third semiconductor layer which is adjacent to said portions of said surfaces of said fourth semiconductor layers, selectively removing said insulation material and said insulation film while using a resist pattern which includes said opening to thereby expose said third semiconductor layer and said portions of said fourth semiconductor layers which are adjacent to said third semiconductor layer;

a tenth step of stacking a conductive layer on said third and fourth semiconductor layer which is exposed after said ninth step and on said surface of said insulation material; and an eleventh step of stacking a conductive layer on said second major surface of said semiconductor substrate which is on an opposite side to said first major surface.

\* \* \* \* \*